United States Patent
Sharon et al.

(10) Patent No.: US 10,218,384 B2
(45) Date of Patent: Feb. 26, 2019

(54) ECC DECODER WITH MULTIPLE DECODING MODES

(71) Applicant: SANDISK TECHNOLOGIES LLC, Plano, TX (US)

(72) Inventors: Eran Sharon, Rishon Lezion (IL); Idan Goldenberg, Ramat Hasharon (IL); Ishai Ilani, Dolev (IL); Idan Alrod, Herzliya (IL); Yuri Ryabinin, Beer Sheva (IL); Yan Dumchin, Beer Sheva (IL); Mark Fiterman, Beer Sheva (IL); Ran Zamir, Ramat Gan (IL)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 15/366,859

(22) Filed: Dec. 1, 2016

(65) Prior Publication Data

US 2018/0159553 A1    Jun. 7, 2018

(51) Int. Cl.
| | |
|---|---|
| G06F 11/10 | (2006.01) |
| G06F 3/06 | (2006.01) |
| H03M 13/11 | (2006.01) |
| H03M 13/17 | (2006.01) |
| H03M 13/37 | (2006.01) |

(52) U.S. Cl.
CPC ........ *H03M 13/1111* (2013.01); *G06F 3/064* (2013.01); *G06F 3/0619* (2013.01); *G06F 3/0679* (2013.01); *G06F 11/1076* (2013.01); *H03M 13/116* (2013.01); *H03M 13/3707* (2013.01); *H03M 13/3746* (2013.01)

(58) Field of Classification Search
CPC ........ H03M 13/1111; H03M 13/3746; H03M 13/3707; H03M 13/11; G06F 3/0679; G06F 3/064; G06F 3/0619; G06F 11/1076
USPC ........................................................ 714/755
See application file for complete search history.

(56) References Cited

U.S. PATENT DOCUMENTS

| | | | |
|---|---|---|---|
| 7,318,186 B2 | 1/2008 | Yokokawa et al. | |
| 7,509,480 B2 * | 3/2009 | Jensen | G06F 9/30076 712/209 |

(Continued)

OTHER PUBLICATIONS

United States Patent Office Action for U.S. Appl. No. 15/638,045 dated Aug. 3, 2018 (12 pages).

(Continued)

*Primary Examiner* — James C Kerveros
(74) *Attorney, Agent, or Firm* — Michael Best & Friedrich LLP

(57) ABSTRACT

A device includes a low density parity check (LDPC) decoder that configured to receive a representation of a codeword. The LDPC decoder includes a message memory configured to store decoding messages, multiple data processing units (DPUs), a control circuit, and a reordering circuit. The control circuit is configured to enable a first number of the DPUs to decode the representation of the codeword in response to a decoding mode indicator indicating a first decoding mode and to enable a second number of the DPUs to decode the representation of the codeword in response to the decoding mode indicator indicating a second decoding mode. The reordering circuit is configured to selectively reorder at least one of the decoding messages based on the decoding mode indicator.

19 Claims, 8 Drawing Sheets

(56) References Cited

U.S. PATENT DOCUMENTS

| | | |
|---|---|---|
| 7,818,649 B1 | 10/2010 | Farjadrad et al. |
| 8,281,210 B1 | 10/2012 | Farjadrad et al. |
| 8,407,567 B2 | 3/2013 | Gunnam |
| 8,549,375 B2 * | 10/2013 | Ueng ................. H03M 13/1111 |
| | | 714/752 |
| 8,578,238 B2 | 11/2013 | Priewasser et al. |
| 9,135,108 B2 | 9/2015 | Shinohara et al. |
| 9,438,276 B2 * | 9/2016 | Varnica ............. H03M 13/1105 |
| 9,461,671 B1 * | 10/2016 | Chang ................. H03M 13/112 |
| 2004/0123230 A1 | 6/2004 | Lee et al. |
| 2007/0011586 A1 * | 1/2007 | Belogolovyi ...... H03M 13/1111 |
| | | 714/774 |
| 2007/0180349 A1 | 8/2007 | Jacobsen |
| 2011/0126078 A1 * | 5/2011 | Ueng ................. H03M 13/1111 |
| | | 714/755 |
| 2012/0240007 A1 * | 9/2012 | Barndt ............... H03M 13/1108 |
| | | 714/758 |
| 2012/0290894 A1 | 11/2012 | Graef et al. |
| 2013/0073922 A1 * | 3/2013 | Varnica ............. H03M 13/1105 |
| | | 714/758 |
| 2014/0006898 A1 | 1/2014 | Sharon et al. |
| 2014/0122962 A1 | 5/2014 | Kodavalla |
| 2015/0128006 A1 | 5/2015 | Alhussien et al. |
| 2015/0381206 A1 | 12/2015 | Fainzilber et al. |
| 2016/0134305 A1 | 5/2016 | Morero et al. |
| 2016/0179620 A1 | 6/2016 | Bazarsky et al. |
| 2016/0301425 A1 | 10/2016 | Morero et al. |
| 2017/0041024 A1 * | 2/2017 | Chang ................. H03M 13/112 |
| 2017/0118125 A1 * | 4/2017 | Mishra ................. H04L 47/193 |
| 2017/0123902 A1 | 5/2017 | Ravimohan et al. |
| 2017/0269991 A1 * | 9/2017 | Bazarsky ............ G06F 11/1012 |
| 2017/0272097 A1 | 9/2017 | Weng |
| 2017/0337965 A1 * | 11/2017 | Ware ........................ G11C 5/04 |

OTHER PUBLICATIONS

United States Patent Office Action for U.S. Appl. No. 15/613,898 dated Nov. 20, 2018 (10 pages).
United States Patent Office Action for U.S. Appl. No. 15/638,045 dated Nov. 26, 2018 (11 pages).
United States Patent Office Action for U.S. Appl. No. 15/630,906 dated Dec. 17, 2018 (11 pages).

* cited by examiner

ECC DECODER WITH MULTIPLE DECODING MODES

FIELD OF THE DISCLOSURE

This disclosure is generally related to data encoding and recovery and more particularly to error correction code (ECC) decoding using multiple decoding modes.

BACKGROUND

Non-volatile data storage devices, such as flash solid state drive (SSD) memory devices or removable storage cards, have allowed for increased portability of data and software applications. Flash memory devices can enhance data storage density by storing multiple bits in each flash memory cell. For example, Multi-Level Cell (MLC) flash memory devices provide increased storage density by storing 2 bits per cell, 3 bits per cell, 4 bits per cell, or more. Although increasing the number of bits per cell and reducing device feature dimensions may increase a storage density of a memory device, a bit error rate of data stored at the memory device may also increase.

Error correction coding (ECC) is often used to correct errors that occur in data read from a memory device. Prior to storage, data may be encoded by an ECC encoder to generate redundant information (e.g., "parity bits") that are associated with parity check equations of the ECC encoding scheme and that may be stored with the data as an ECC codeword. As more parity bits are used, an error correction capacity of the ECC increases and a number of bits to store the encoded data also increases.

ECC codewords may be decoded according to variety of techniques. Some techniques may have a relatively high throughput and low power consumption but may provide relatively low error correction capability, while other techniques may provide relatively high error correction capability but may have lower throughput and increased power consumption. In order to provide high-throughput performance without sacrificing correction capability, ECC decoders may support multiple decoding modes. For example, an ECC decoder may use a low-power, high-throughput bit-flipping mode to decode received data and may transition to a higher-power, lower-throughput soft decoding mode for decoding data having an error rate that exceeds the correction capacity of the bit-flipping mode.

However, because the properties of an ECC code (also referred to as a "code") that is used to generate the codewords may determine the number of data bits that can be independently processed in parallel, the decoding modes implemented by an ECC decoder may be constrained to have the same degree of parallelism during decoding. Design of such an ECC system may be complicated due to competing priorities with regard to silicon area and cost, power budget, error correction capability, worst-case decoding latency, and throughput requirements. For example, although a high degree of parallelism may be beneficial for throughput performance using a bit-flipping mode, the same high degree of parallelism may cause the ECC decoder to exceed a power budget using a high-resolution soft decoding mode.

DETAILED DESCRIPTION

Figure 1:
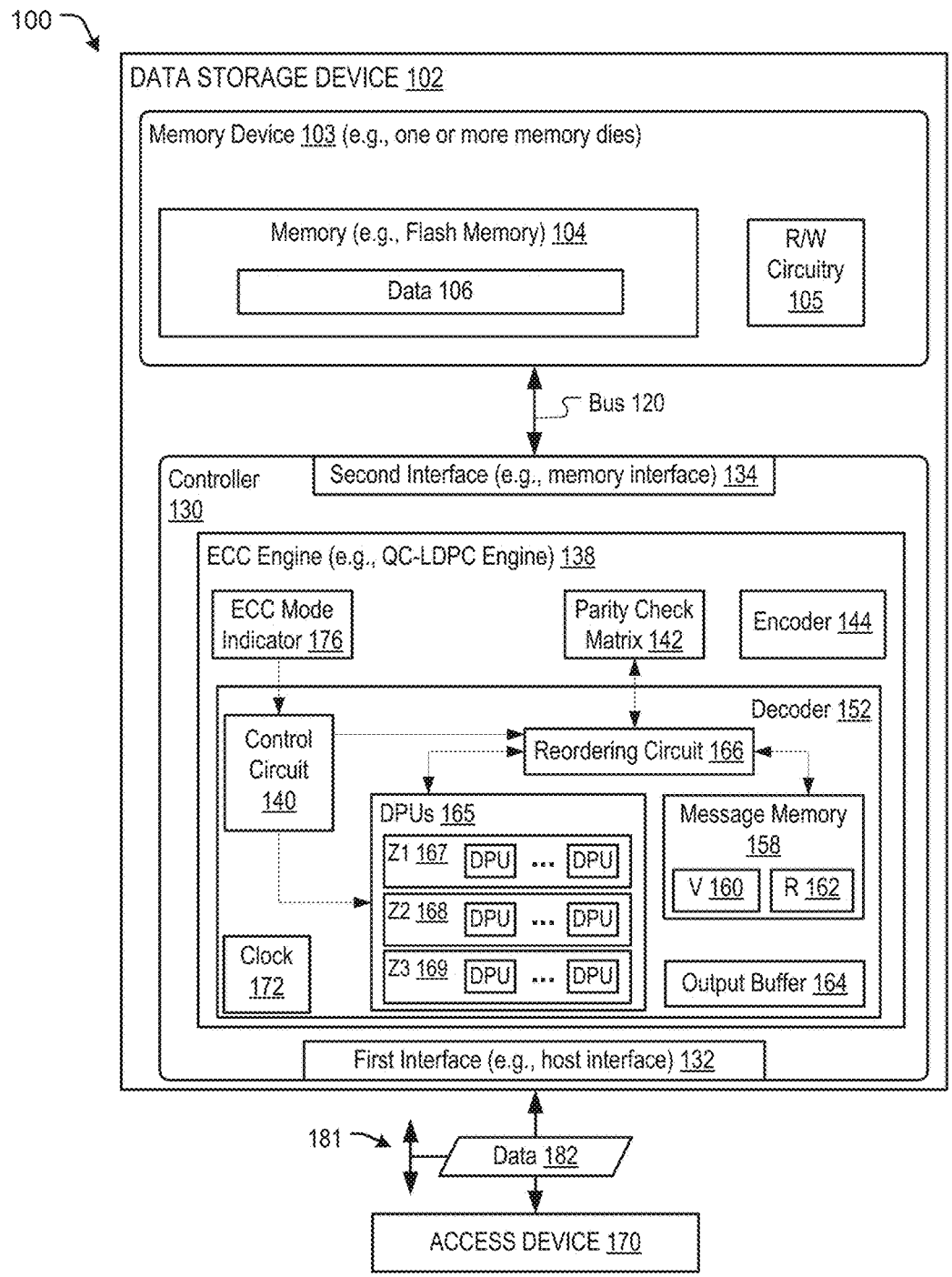
FIG. 1 is a block diagram of an illustrative example of a system including a data storage device including an ECC decoder that supports multiple decoding modes with multiple degrees of parallelism.

Particular examples in accordance with the disclosure are described below with reference to the drawings. In the description, common features are designated by common reference numbers. As used herein, "exemplary" may indicate an example, an implementation, and/or an aspect, and should not be construed as limiting or as indicating a preference or a preferred implementation. Further, it is to be appreciated that certain ordinal terms (e.g., "first" or "second") may be provided for identification and ease of reference and do not necessarily imply physical characteristics or ordering. Therefore, as used herein, an ordinal term (e.g., "first," "second," "third," etc.) used to modify an element, such as a structure, a component, an operation, etc., does not necessarily indicate priority or order of the element with respect to another element, but rather distinguishes the element from another element having a same name (but for use of the ordinal term). In addition, as used herein, indefinite articles ("a" and "an") may indicate "one or more" rather than "one." As used herein, a structure or operation that "comprises" or "includes" an element may include one or more other elements not explicitly recited. Further, an operation performed "based on" a condition or event may also be performed based on one or more other conditions or events not explicitly recited.

The present disclosure describes several methods that may be used to "optimize" the tradeoff between area, throughput, and power consumption of an ECC decoder, such as a low-density parity check (LDPC) decoder, that has multiple decoding modes that differ in correction capability and energy consumption. As used herein, decoding modes are also referred to as decoding "gears."

The methods include setting the parallelism level (i.e., number of data processing units (DPUs)) used by each decoding mode. The parallelism level may be set as a function of the power consumption of the decoding mode, the frequency of use of the decoding mode, the message resolution used by each decoding mode, or any combination thereof. For example, the number of DPUs used by each particular decoding mode (e.g., the number of "active DPUs" for that particular decoding mode) may be set to be inversely proportional to the power consumption of the particular decoding mode, inversely proportional to the message resolution used by the particular decoding mode, proportional to the frequency of use of the particular decoding mode, or any combination thereof.

Because the parallelism level that can be most easily implemented in the decoder is directly related to the code structure (i.e., the code is designed for supporting a given parallelism), implementing a different parallelism for different decoding modes operating on the same code is not trivial. As described in further detail herein, the problem of how to implement a different parallelism for different decoding modes is solved by having different decoding modes operate according to one or more transformed versions of the code (or of the code's parity check matrix). A transform operation on the code's parity check matrix that can adjust the parity-check matrix structure to fit each decoding mode's parallelism level may be implemented in an ECC system. As a result, a given code can be used for decoding under multiple parallelism levels via transformations of the code's parity check matrix. The transform operation can be performed on-the-fly based on a code description that is stored once, and interpreted differently according to the particular transforms corresponding to the different decoding modes.

By setting the ratio between the number of DPUs per decoding mode (i.e., an amount of parallelism per decoding mode) to be inversely proportional to a message resolution used by each decoding mode, hardware components may be shared between the decoding modes. For example, a decoder can re-use components in decoder memories, sampling stages, and shifters. To illustrate, the same memory can be used in one decoding mode to store Z messages of 6 bits and in another decoding mode to store 2*Z messages of 3 bits (where Z is an integer corresponding to a parallelism level, a lifting factor, or block matrix size of a parity check matrix, as described further below). Hence, memories, routing layers, and processing units may be fully re-used between a "stronger" decoding mode that uses 6-bit messages and operates with parallelism Z and a "faster" decoding mode that uses 3-bit messages and operates with parallelism 2*Z.

Although particular examples using specific values (e.g., 6 bits, 3 bits) are described throughout the present disclosure, it should be understood that such examples are included for purposes of illustration and are not to be construed as limitations. To illustrate, although the above example describes a "stronger" mode that uses 6-bit messages and a "faster" mode that uses 3-bit messages, in other implementations a stronger decoding mode may use messages having a different resolution (e.g., 5 bits, 7 bits, or any other number of bits), a "faster" decoding mode may use messages having a different resolution (e.g., 2 bits, 4 bits, or any other number of bits), or a combination thereof.

Components of an ECC decoder, including a memory structure, DPUs, and routing from memory to the DPUs, may be designed to enable a large amount of hardware re-use between different decoding modes having different parallelism factors and different message resolutions. Examples of such components, in addition to examples of implementing the on-the-fly transform of the code's parity-check matrix to fit into the multiple parallelism levels used by the different decoding modes, are described in further detail with reference to FIGS. 1-9.

FIG. 1 depicts an illustrative example of a system 100 that includes a data storage device 102 and an access device 170 (e.g., a host device or another device). The data storage device 102 is configured to perform ECC decoding operations using multiple decoding modes having different levels of parallelism, as described further herein.

The data storage device 102 and the access device 170 may be coupled via a connection (e.g., a communication path 181), such as a bus or a wireless connection. The data storage device 102 may include a first interface 132 (e.g., an access device or host interface) that enables communication via the communication path 181 between the data storage device 102 and the access device 170.

The data storage device 102 may include or correspond to a solid state drive (SSD) which may be included in, or distinct from (and accessible to), the access device 170. For example, the data storage device 102 may include or correspond to an SSD, which may be used as an embedded storage drive (e.g., a mobile embedded storage drive), an enterprise storage drive (ESD), a client storage device, or a cloud storage drive, as illustrative, non-limiting examples. In some implementations, the data storage device 102 is coupled to the access device 170 indirectly, e.g., via a network. For example, the network may include a data center storage system network, an enterprise storage system network, a storage area network, a cloud storage network, a local area network (LAN), a wide area network (WAN), the Internet, and/or another network. In some implementations, the data storage device 102 may be a network-attached storage (NAS) device or a component (e.g., a solid-state drive (SSD) device) of a data center storage system, an enterprise storage system, or a storage area network.

In some implementations, the data storage device 102 may be embedded within the access device 170, such as in accordance with a Joint Electron Devices Engineering Council (JEDEC) Solid State Technology Association Universal Flash Storage (UFS) configuration. For example, the data storage device 102 may be configured to be coupled to the access device 170 as embedded memory, such as eMMC® (trademark of JEDEC Solid State Technology Association, Arlington, Va.) and eSD, as illustrative examples. To illustrate, the data storage device 102 may correspond to an eMMC (embedded MultiMedia Card) device. As another example, the data storage device 102 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). Alternatively, the data storage device 102 may be removable from the access device 170 (i.e., "removably" coupled to the access device 170). As an example, the data storage device 102 may be removably coupled to the access device 170 in accordance with a removable universal serial bus (USB) configuration.

The data storage device 102 may operate in compliance with an industry specification. For example, the data storage device 102 may include a SSD and may be configured to communicate with the access device 170 using a small computer system interface (SCSI)-type protocol, such as a serial attached SCSI (SAS) protocol. As other examples, the data storage device 102 may be configured to communicate with the access device 170 using a NVM Express (NVMe) protocol or a serial advanced technology attachment (SATA) protocol. In other examples, the data storage device 102 may operate in compliance with a JEDEC eMMC specification, a JEDEC Universal Flash Storage (UFS) specification, one or more other specifications, or a combination thereof, and may be configured to communicate using one or more protocols, such as an eMMC protocol, a universal flash storage (UFS) protocol, a universal serial bus (USB) protocol, and/or another protocol, as illustrative, non-limiting examples.

The access device 170 may include a memory interface (not shown) and may be configured to communicate with the data storage device 102 via the memory interface to read data from and write data to a memory device 103 of the data storage device 102. For example, the access device 170 may be configured to communicate with the data storage device 102 using a SAS, SATA, or NVMe protocol. As other examples, the access device 170 may operate in compliance with a Joint Electron Devices Engineering Council (JEDEC) industry specification, such as a Universal Flash Storage (UFS) Access Controller Interface specification. The access device 170 may communicate with the memory device 103 in accordance with any other suitable communication protocol.

The access device 170 may include a processor and a memory. The memory may be configured to store data and/or instructions that may be executable by the processor. The memory may be a single memory or may include multiple memories, such as one or more non-volatile memories, one or more volatile memories, or a combination thereof. The access device 170 may issue one or more commands to the data storage device 102, such as one or more requests to erase data, read data from, or write data to the memory device 103 of the data storage device 102. For example, the access device 170 may be configured to provide data, such as data 182, to be stored at the memory device 103 or to request data to be read from the memory device 103. The access device 170 may include a mobile telephone, a computer (e.g., a laptop, a tablet, or a notebook computer), a music player, a video player, a gaming device or console, an electronic book reader, a personal digital assistant (PDA), a portable navigation device, a computer, such as a laptop computer or notebook computer, a network computer, a server, any other electronic device, or any combination thereof, as illustrative, non-limiting examples.

The memory device 103 of the data storage device 102 may include one or more memory dies (e.g., one memory die, two memory dies, eight memory dies, or another number of memory dies). The memory device 103 includes a memory 104, such as a non-volatile memory of storage elements included in a memory die of the memory device 103. For example, the memory 104 may include a flash memory, such as a NAND flash memory, or a resistive memory, such as a resistive random access memory (ReRAM), as illustrative, non-limiting examples. In some implementations, the memory 104 may include or correspond to a memory die of the memory device 103. The memory 104 may have a three-dimensional (3D) memory configuration. As an example, the memory 104 may have a 3D vertical bit line (VBL) configuration. In a particular implementation, the memory 104 is a non-volatile memory having a 3D memory configuration that is monolithically formed in one or more physical levels of arrays of memory cells having an active area disposed above a silicon substrate. Alternatively, the memory 104 may have another configuration, such as a two-dimensional (2D) memory configuration or a non-monolithic 3D memory configuration (e.g., a stacked die 3D memory configuration).

Although the data storage device 102 is illustrated as including the memory device 103, in other implementations the data storage device 102 may include multiple memory devices that may be configured in a similar manner as described with respect to the memory device 103. For example, the data storage device 102 may include multiple memory devices, each memory device including one or more packages of memory dies, each package of memory dies including one or more memories such as the memory 104.

The memory 104 may include one or more blocks, such as a NAND flash erase group of storage elements. Each storage element of the memory 104 may be programmable to a state (e.g., a threshold voltage in a flash configuration or a resistive state in a resistive memory configuration) that indicates one or more values. Each block of the memory 104 may include one or more word lines. Each word line may include one or more pages, such as one or more physical pages. In some implementations, each page may be configured to store a codeword. A word line may be configurable to operate as a single-level-cell (SLC) word line, as a multi-level-cell (MLC) word line, or as a tri-level-cell (TLC) word line, as illustrative, non-limiting examples.

The memory device 103 may include support circuitry, such as read/write circuitry 105, to support operation of one or more memory dies of the memory device 103. Although depicted as a single component, the read/write circuitry 105 may be divided into separate components of the memory device 103, such as read circuitry and write circuitry. The read/write circuitry 105 may be external to the one or more dies of the memory device 103. Alternatively, one or more individual memory dies of the memory device 103 may include corresponding read/write circuitry that is operable to read data from and/or write data to storage elements within the individual memory die independent of any other read and/or write operations at any of the other memory dies.

The data storage device 102 also includes a controller 130 that is coupled to the memory device 103 via a bus 120, an interface (e.g., interface circuitry, such as a second interface 134), another structure, or a combination thereof. For example, the bus 120 may include one or more channels to enable the controller 130 to communicate with a single memory die of the memory device. As another example, the bus 120 may include multiple distinct channels to enable the controller 130 to communicate with each memory die of the memory device 103 in parallel with, and independently of, communication with other memory dies of the memory device 103.

The controller 130 is configured to receive data and instructions from the access device 170 and to send data to the access device 170. For example, the controller 130 may send data to the access device 170 via the first interface 132, and the controller 130 may receive data from the access device 170 via the first interface 132. The controller 130 is configured to send data and commands to the memory 104 and to receive data from the memory 104. For example, the controller 130 is configured to send data and a write command to cause the memory 104 to store data to a specified address of the memory 104. The write command may specify a physical address of a portion of the memory 104 (e.g., a physical address of a word line of the memory 104) that is to store the data. The controller 130 may also be configured to send data and commands to the memory 104 associated with background scanning operations, garbage collection operations, and/or wear leveling operations, etc., as illustrative, non-limiting examples. The controller 130 is configured to send a read command to the memory 104 to access data from a specified address of the memory 104. The read command may specify the physical address of a portion of the memory 104 (e.g., a physical address of a word line of the memory 104).

The controller includes an ECC engine 138 that is configured to receive data to be stored to the memory 104 and to generate a codeword. For example, the ECC engine 138 may include an encoder 144 configured to encode data using an ECC scheme, such as a Reed Solomon encoder, a Bose-Chaudhuri-Hocquenghem (BCH) encoder, a low-density parity check (LDPC) encoder, a Turbo Code encoder, an encoder configured to encode one or more other ECC encoding schemes, or any combination thereof. The ECC engine 138 may include one or more decoders, such as a decoder 152, configured to decode data read from the memory 104 to detect and correct, up to an error correction capability of the ECC scheme, any bit errors that may be present in the data.

The ECC engine 138 may be implemented as a quasi-cyclic (QC) LDCP engine. The ECC engine 138 may include the encoder 144, the decoder 152, a parity check matrix 142, and an ECC mode indicator 176. The parity check matrix 142 may include information corresponding to an ECC code, such as address and shift amounts of shifted identity sub-matrixes, such described further with reference to FIG. 2. The ECC mode indicator 176 may include one or more bits, flags, or other indicators to indicate a decoding mode of the decoder 152. For example, in an implementation where the decoder 152 supports three decoding modes, the ECC mode indicator 176 may indicate a selected one of the three decoding modes for the decoder 152 to process data. The ECC mode indicator 176 may be provided to the decoder 152, such as via access by a control circuit 140 of the decoder 152. The ECC mode indicator 176 may be stored in one or more registers, latches, or other components configured to store an indicator.

The decoder 152 includes the control circuit 140, a clock 172, a message memory 158, an output buffer 164, multiple DPUs 165, and a reordering circuit 166. The control circuit 140 is responsive to the ECC mode indicator 176 to send configuration signals to the reordering circuit 166 and to the DPUs 165. For example, the control circuit 140 may be responsive to the ECC mode indicator 176 indicating a first decoding mode, and may indicate to the DPUs 165 that a first group 167 of the DPUs 165 are to be used for decode processing of received data. The control circuit 140 may also indicate to the reordering circuit 166 an amount (if any) of transformation to be applied for use in the indicated decoding mode. Examples of such transformations are described in further detail with reference to FIGS. 2-4.

The DPUs 165 include the first group of DPUs 167, a second group of DPUs 168, and a third group of DPUs 169. The first group of DPUs 167 includes a first number "Z1" of DPUs. The second group of DPUs 168 includes a second number "Z2" of DPUs, and the third group of DPUs 169 includes a third number "Z3" of DPUs. In an implementation where the first group of DPUs 167 is used for a lowest power processing mode, such as an ultra-low power (ULP) mode, the number Z1 of DPUs may correspond to a parallelism of the parity check matrix 142. When the second group of DPUs 168 corresponds to a message passing soft decoding mode using a first resolution (e.g., a low-power (LP) decoding mode), the second group of DPUs 168 may include a smaller number of DPUs than the first group, e.g., Z2<Z1. Similarly, the third group of DPUs 169 may be used for a full power (FP) decoding mode that uses even fewer DPUs (e.g., Z3<Z2). The DPUs 165 are therefore responsive to the control circuit 140 for selection and enablement of one or more of the groups of DPUs 167, 168, 169 for use during decode processing at the decoder 152.

The message memory 158 may include a random access memory (RAM) configured to store one or more messages for use during decoding at the decoder 152. For example, the message memory 158 may include data (messages) corresponding to values of variable nodes, such as within a variable node partition "V" 160 of the message memory 158. Similarly, the message memory 158 may include data (messages) corresponding to check node values, such as at a second partition "R" 162, for use during decoding operations at the decoder 152. Although the message memory 158 is illustrated as a single component, in other implementations the decoder 152 may implement multiple memory structures for message storage.

The output buffer 164 may be configured to store data indicating error corrected versions of data read from the memory 104, such an error corrected version of data 106 read form the memory 104, after completion of decoding at the decoder 152. Data stored in the output buffer 164 may be provided to the access device 170 via the first interface 132.

The ordering circuit 166 is configured to perform one or more transformations of the parity check matrix 142 to enable decode processing at the decoder 152 according to a selected one of the multiple decoding modes, each of the multiple decoding modes using a different degree of parallelism. For example, as used herein, a degree of parallelism may be indicated by a number of the DPUs 165 that are operating concurrently during decode processing. For example, in a first decoding mode (e.g., a ULP mode), a parallelism of Z1 may be obtained using the first group of DPUs 167, a parallelism of Z2 may be obtained in a second decoding mode (e.g., an LP mode) using the second group of DPUs 168, and a parallelism of Z3 may be obtained in a third decoding mode (e.g., a FP mode) using the third group of DPUs 169. By performing reordering of messages of the message memory 158, the reordering circuit 166 enables each of the decoding modes to be structured based on a frequency of use of the decoding mode, while satisfying power budget and silicon area criteria of the decoder 152, and avoiding a need to adjust the clock 172 to accommodate higher power decoding modes. Operation of components of the decoder 152 are described in further detail with reference to FIGS. 2-4.

During operation, the controller 130 may receive a request to retrieve the data 106, such as from the access device 170. Responsive to the request, the data 106 is read from the memory 104. The read data 106 may differ from the data 106 originally stored into the memory 104 due to the introduction of one or more bit errors during retention of the data 106 in the memory 104. The LDPC decoder 152 may receive the data 106 (including the one or more errors) in the message memory 158. The controller 130 (e.g., the ECC engine 138) may select a decoding mode to correct the one or more errors. For example, the ECC engine 138 (e.g., the decoder 152) may select a default mode, such as the ULP mode, or may select a particular mode based on an estimated bit error rate (BER) of the read data 106. The ECC mode indicator 176 is set by the controller 130 or the ECC engine 138 to indicate the selected decoding mode. The control circuitry 140 receives the ECC mode indicator 176 and issues control signals to configure the DPUs 165 and the reordering circuit 166 for the selected decoding mode. The reordering circuit 166 is used to calculate, for the selected FP, LP or ULP mode, column strip and shift indexes, as described below. The reordering circuit 166 may re-route the data bits from the message memory 158 to the DPUs 165 according to the QC LDPC matrix and the calculated column shifts and indexes, as described further with reference to FIGS. 2-4.

The control circuit 140 selects one (or more) of the groups of DPUs 167-169 to calculate in parallel the strip checks and variable and messages updates. For example, each of the selected DPUs may perform decode computations synchronously based on the clock 172. Next, the reordering circuit 166 is used to shift the data from the DPUs 165 back to message memory 158 and ultimately to the output buffer 164.

If decoding fails using the selected mode, the decoding mode indicator 176 may be updated to indicate selection of a higher-power decoding mode. In response to the updated indicator 176, the control circuit 140 may reconfigure the reorder circuit 166, may select/enable another (or an additional) group of DPUs 167-169, and may initiate decoding using the higher-power decoding mode. Although three groups of DPUs 165 are depicted to support three levels of parallelism in three decoding modes, in other implementations the DPUs 165 may include a different number of groups to support a different number of decoding modes. For example, in some implementations the decoder 152 may support two decoding modes, three decoding modes, four decoding modes, or any other number of decoding modes.

An "optimal" tradeoff between area, throughput and power consumption of an LDPC decoder may be achieved when the amount of parallelism is dimensioned according to throughput criteria and available power budget. During most of the lifetime of memory devices, such as flash memory devices, low bit error rates (BER) are typically encountered. Hence, the LDPC engine 138 may decode most of the time in a ULP mode, which may be the highest throughput and lowest power LDPC mode. If decoding in ULP mode fails, LP or FP modes may be used to decode data optionally using soft bits. However, because the ULP failure events are relatively rare, using a reduced number of DPUs for the LP and FP modes may have negligible influence on the overall decoder throughput, but may beneficially reduce the logic resources and the memory area used by the decoder 152. As an example, the decoder 152 may use 4*N DPUs for ULP, 2*N DPUs for LP, and N DPUs for FP decoding modes (also referred to as "power modes") (N is a positive integer).

Another consideration in designing decoders is peak power. In many cases, due to a peak power criteria, a large number of DPUs for the LP and FP modes (e.g., 64 DPUs) may not be usable with a full clock frequency. Satisfying the power criteria may require reducing the decoder clock frequency when moving to an LP or FP decoding mode. In this case, a decoder does not benefit from having a large number of DPUs due to the clock frequency reduction. Instead, the decoder 152 may use a smaller number of DPUs for the higher decoding power modes, without reducing the frequency of the decoder clock 172, to reduce decoder cost and size without sacrificing decoding power or latency.

A well-known class of LDPC codes, which is widely used in storage and communication standards, is Quasi-Cyclic (QC) LDPC codes, also known as LDPC codes based on lifted graphs (with cyclic lifting patterns). Such QC-LDPC codes can be represented by a proto-graph and lifting labels on the protograph edges. Alternatively, a QC-LDPC code can be represented by a QC block parity-check matrix that includes Z*Z "0" block matrices and cyclically shifted Z*Z unity matrices, where each such Z*Z (e.g., Z may be 64, 128, 512, etc.) cyclically shifted unity matrix is characterized by its shift from the diagonal, denoted by "k."

Figure 2:
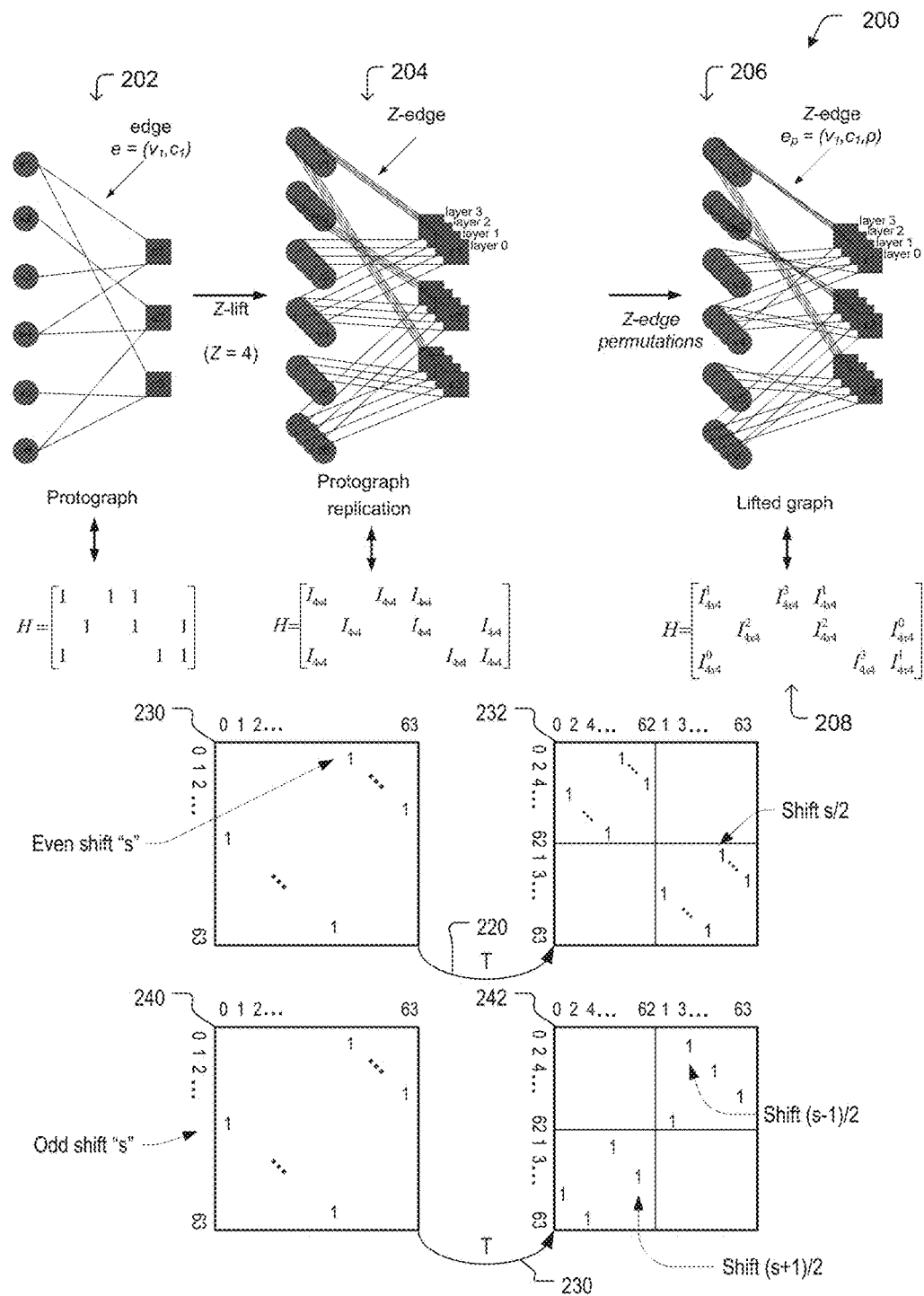
FIG. 2 is a diagram of a particular example of LDPC code construction, parity check matrices, and an even-odd transformation that may be used by the data storage device of FIG. 1.

FIG. 2 is a diagram of a particular example of QC-LDPC code construction based on lifted graphs and corresponding parity check matrices. FIG. 2 also illustrates examples of an even-odd transformation that may be used by the data storage device of FIG. 1.

A first graph 202 illustrates a "protograph" of an LDPC code, showing variable nodes as circles, check nodes as squares, and lines indicating edges between the variable nodes and the check nodes. A parity check matrix H corresponding to the protograph 202 includes "1" elements indicating the presence of an edge between the associated variable node (column) and check node (row) of the protograph and "0" elements (not shown) indicating the absence of an edge. A second graph 204 illustrates the result of replication of the graph 202 into four layers (Z=4). The parity check matrix H corresponding to the second graph 204 includes 4×4 identity sub-matrices in place of the "1" elements of the H matrix of graph 202. A third graph 206 illustrates the result of performing Z-edge permutations to the second graph 204. The parity check matrix H 208 corresponding to the lifted graph 206 includes cyclically shifted identity sub-matrices representing the permutations applied to the edges in the lifted graph 206.

One of the main reasons that QC-LDPC codes are widely adopted in industry standards is the amenability of QC-LDPC codes for high throughput parallel processing by iterative message passing decoders. Such decoding includes storing groups of Z messages corresponding to a "lifted edge" of the lifted graph in a single memory address, such that all Z messages may be accessed, processed and updated simultaneously using Z DPUs. The routing of the Z messages read from the single memory address to the Z DPUs is also simplified and can be performed using a simple barrel shifter, by limiting the graph lifting to cyclic shifts.

In order to utilize the cyclic lifted graph structure which enables low complexity parallel processing of multiple messages for all the decoding modes (ULP/LP/FP) while using a different parallelism ratio ($Z_{ULP}/Z_{LP}/Z_{FP}$), a novel transformation may be applied to the rows and columns of the parity check matrix used during the different decoding modes. For example, this transformation may transform a QC parity check matrix with block size $Z_{ULP}$ during ULP decoding to a QC parity check matrix with block size $Z_{LP}$ during LP decoding and to a QC parity check matrix with block size $Z_{FP}$ during FP decoding.

An LDPC parity check matrix that is constructed from cyclically shifting Z*Z unit matrices may therefore be transformed into an alternative parity check matrix with smaller cyclically shifted blocks using a multi-resolution transformation. The transform is based on performing a permutation of the variable nodes and performing a corresponding permutation of the columns and rows of the parity check matrix that enables transforming the original QC parity check matrix with block size $Z_{ULP}$ into transformed parity check matrices with smaller block sizes of $Z_{LP}$ and $Z_{FP}$, such as $Z_{LP}=Z_{ULP}/2$ and $Z_{FP}=Z_{ULP}/4$. As a non-limiting example, $Z_{ULP}=64$ in ULP mode, $Z_{LP}=32$ in LP mode, and $Z_{FP}=16$ in FP mode may be utilized. However the multi-resolution is general and may provide other resolutions alternatively, or in addition to, the $Z_{ULP}/Z_{LP}/Z_{FP}=64/32/16$ described herein (e.g., $Z_{ULP}=512/Z_{LP}=128/Z_{FP}=64$).

The multi-resolution transformation is reversible and may be performed first at the LDPC encoder 144 before storing the encoded data in the memory 104 and may later be inversed in the LDPC decoder 152, where for example Z/4*Z/4 cyclically shifted matrices may be used at the LDPC encoder 144 that may be later decoded as-is, e.g., Z4*Z/4 matrices (in FP mode), or that may be transformed to Z/2*Z/2 (in LP mode) or to Z*Z (in ULP mode) at the LDPC decoder 152 according to the LDPC power mode.

The transformation can be implemented by the reordering circuit 166 using logic that manipulates the message memory address and a routing layer shift while using a single description of the code's graph (the parity-check matrix 142), which is "interpreted" differently according to the transform during ULP, LP, or FP decoding. For example, in a first decoding mode the LDPC decoder 152 may process a representation of a codeword based on a first permuted version of the parity check matrix 142 (e.g., a transformation generated by the reordering circuit 166), and in a second decoding mode the LDPC decoder 152 may process a representation of a codeword based on a second permuted version of the parity check matrix 142. In other implementations, multiple different QC-LDPC parity check matrices may be stored at the ECC engine 138 and retrieved based on which decoding mode is selected, rather than the reordering circuit 166 generating permutations of the parity check matrix 142.

Another aspect is related to efficient hardware re-use between the different decoding power modes as a function of the message bit resolution that is used by each decoding mode. For example, the LP and FP modes may use the same decoding algorithm but with different message resolution. Hence, both modes can re-use the same hardware. As the FP message resolution may be double than the LP message resolution (e.g., 6 bits vs. 3 bits), then by setting the LP parallelism to be double than the FP parallelism ($Z_{LP}=2*Z_{FP}$), full hardware re-use and efficiency may be obtained. To illustrate, the same memories and data path can be used for operating in the LP decoder mode with double the parallelism (and hence double the throughput) of the FP mode. In this example, a memory address either stores $Z_{LP}*3$ bits or $Z_{FP}*6$ bits (which are equally sized) that are routed into either $Z_{LP}$ LP DPUs or $Z_{FP}$ FP DPUs. There can also be hardware re-use between the LP and FP DPUs, as the LP DPUs perform similar computations as the FP DPUs but with different resolution (i.e., different message sizes). Thus, FP DPUs may be used in the FP mode and may also be used (with reduced resolution) in the LP mode along with additional LP DPUs.

In such an implementation, both the LP and FP modes have similar power consumption; however, the LP mode provides double the decoding throughput using the same amount of power as the FP mode.

To summarize, by setting the ratio between the number of DPUs per decoding mode (i.e., parallelism per decoding mode) to be inversely proportional to the message resolution used by each decoding mode, an efficient hardware re-use can be implemented, especially in the decoder memories, sampling stages, and shifters.

The transformation applied by the reordering circuit 166 that enables multi-resolution processing at the decoder 152 may be referred to as the even-odd (EO) transformation. This transformation is applied to Z*Z matrices that are obtained by cyclically shifting the columns of an identity matrix of order Z. Informally, the transformation swaps the rows and columns of the matrix such that the even index rows and columns appear first. This is illustrated in FIG. 2, which shows an example of applying the EO transformation to an identity matrix whose columns are cyclically shifted, the shift being denoted by "s" (s is an integer having any value in the range 0, 1, ..., Z−1). In the case where the shift s is even, such as in a matrix 230, the resulting matrix 232 after the EO transformation 220 is a block matrix where the upper right and lower left blocks are all zero, and the upper left and lower right blocks are identity matrices of order Z/2 shifted by a shift s/2. In the case where s is an odd number, such as a matrix 240, the positions of the non-zero blocks and their corresponding shifts after the EO transformation 220 are different, as shown in the resulting matrix 242. Since the transformation 220 is a permutation of indices, it is invertible.

Applying the EO transformation enables a multi-resolution LDPC decoding. For example, a decoder "A" (e.g., the LP mode of the decoder 152) may operate with parallelism factor Z and a decoder "B" (e.g., the FP mode of the decoder 152) may operate with parallelism factor Z/2. Data may be written to the memory 104 after performing the EO transformation on the encoded data. (Note that it is not mandatory to apply the transformation prior to writing to the memory 104 since it is straightforward to transition between the transformed vector and the de-transformed vector. Each Z-tuple of bits written to the memory 104 may be rearranged such that the even indices appear first, followed by the odd indices. The rearranged Z-tuple may be written to the memory 104. Decoder A can operate on the entire layer of Z bits while employing Z DPUs, by reading the entire Z-tuple (arranged as two halves, each cyclically shifted by a shift in the range 0, 1, ..., Z/2), de-permuting the Z-tuple, and operating normally on the resulting Z-tuple. Decoder B can operate on the upper layer and lower layer separately.

More generally, the EO transformation can be applied recursively multiple times to the original Z*Z matrix (e.g., after applying it once to the original matrix, the EO is reapplied to each non-zero Z/2*Z*2 block, and then reapplied recursively to each resulting Z/4*Z*4 block, etc.), and this can enable wider differences between the parallelism factors of different decoders. As an example, a decoder may have $Z_{ULP}=512/Z_{LP}=128/Z_{FP}=64$, which means there is a factor of 8 between the minimum and maximum parallelism factors. Consequently, the underlying EO transformation is of order 3 (i.e., applied recursively 3 times).

Even more generally, computation may be performed for the matrix product y=Ax, where x,y are vectors (e.g. binary vectors), A is a Z*Z matrix (e.g. binary matrix), and the product is computed over the binary field GF(2). This computation may be performed directly, but it may also be performed by applying a permutation π0 to x,y,A. Explicitly the permutation π may be applied to both the rows of A and to the columns of A. When π is applied to the rows of A it is represented by a matrix P which multiplies A from the left, and when π is applied to the columns of A it is represented by the matrix $P^{-1}$ which multiplies A from the right. The result of applying the permutation π to the rows and columns of A is therefore represented by a permuted-matrix $PAP^{-1}$. Applying the permutation π to x is represented by a permuted-vector-x Px. Applying the permuted-matrix to the permuted-vector-x results in $PAP^{-1}Px=PAx=Py$, denoted as permuted-vector-y. Applying the inverse permutation $P^{-1}$ to Py results in the original vector y.

Figure 3:
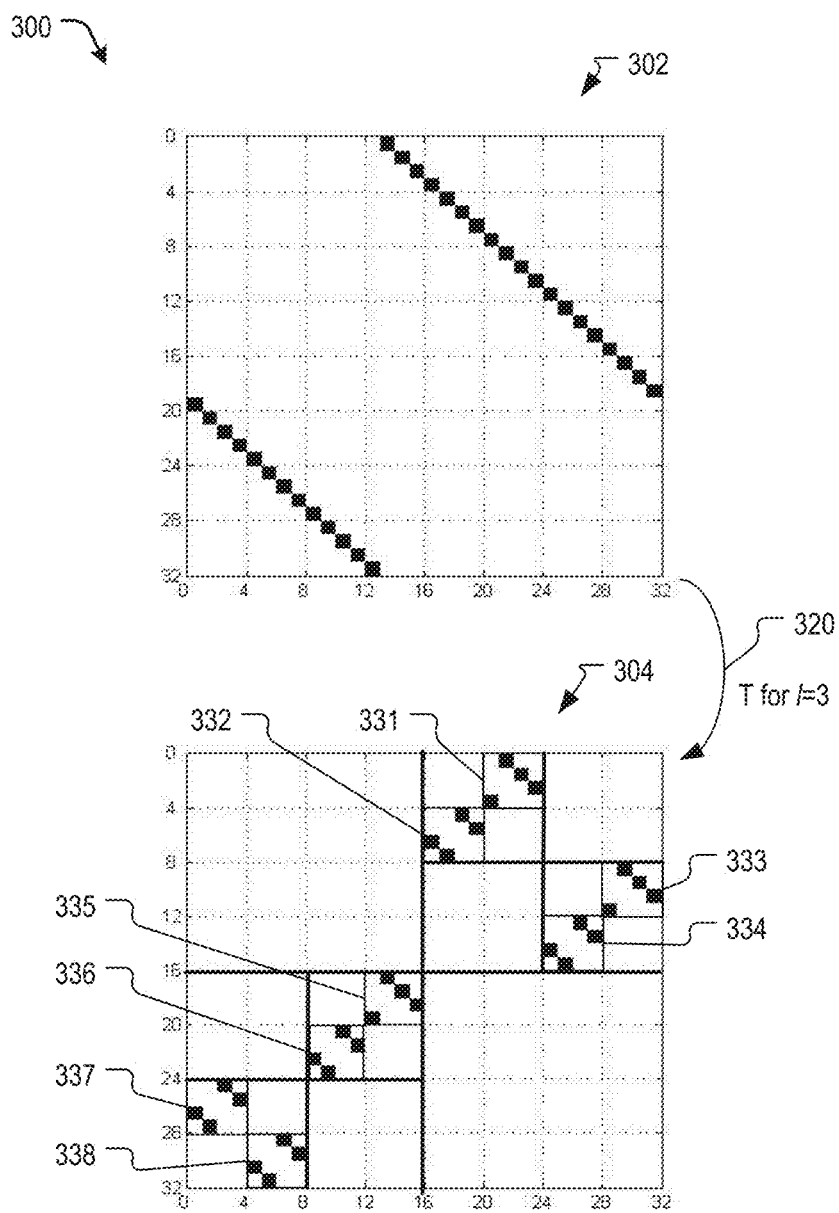
FIG. 3 is a diagram of a particular example of an even-odd transformation of a block matrix of a parity check matrix that may be used by the data storage device of FIG. 1.

Suppose A is the matrix 302 of FIG. 3. Computing Ax directly involves reading all 32 coordinates of x, and the result is a 32 coordinate vectory. If this is performed in one clock of a hardware (HW) machine, then at this clock all 32 coordinates are read, and all 32 coordinates of y are written back to memory. Reading the input vector x from the memory and writing the output vector y to the memory may be relatively uncomplicated, since both the 32 input coordinates and 32 output coordinates may be arranged to reside in consecutive 32 addresses in memory. Therefore, one memory access may be sufficient for both read and write. If a parallelism of 32 is unattainable for the system, and instead the system were designed to perform the computation in 2 steps of 16 coordinates in each step, system design becomes more complicated. For example, consider reading the first 16 coordinates of x in one clock, computing just the relevant coordinates of y, and writing them back to memory. If A is the matrix 302, then the first 16 consecutive coordinates of x give the results of the last 13 coordinates of y and the first 3 coordinates of y. Thus writing y to the memory may be relatively complicated. If the memory is accessible in resolution of 16 coordinates, then both the first 16 coordinates, and the last 16 coordinates are written just for writing the last 13 coordinates and first 3 coordinates of y. On a second clock the coordinates in positions 4-19 of y are written to memory. Again, since y is accessed in a resolution of 16 coordinates (beginning with the 1$^{st}$ position), this involves 2 writes.

However, if A is a matrix representing a cyclic permutation (for example A is the matrix 302 of FIG. 3), and if P is an EO$_l$ transformation, and if the input vector x is stored in memory according to the permutation Px, and y is computed by applying PAP$^{-1}$ to Px, system design may be relatively less complicated. For example, suppose P is a permutation matrix of an EO$_3$ transformation. Then PAP$^{-1}$ is represented by the matrix 304 of FIG. 3. The computation of PAP$^{-1}$·Px may be performed in various resolutions, where for each of the resolutions, in each computing step, consecutive input elements are read and consecutive output elements are written. For example, computing PAP$^{-1}$·Px may be performed by 8 parallel processing steps, where each processing step receives 4 consecutive values of Px. and computes 4 consecutive values of Py. Considering the matrix of 304, the first processing step receives as input coordinates 21-24 of Px, and computes the first 4 coordinates 1-4 of Py according to multiplication by the submatrix 331. The second processing step receives as input coordinates 17-20 of Px, and computes the next 4 coordinates 5-8 of Py according to multiplication by the submatrix 332. The example continues up to the eighth processing step which receives as input coordinates 5-8 of Px, and computes the last 4 coordinates 29-32 of Py. If the results are stored in the memory according to the permuted order, then there is no need to apply the inverse permutation to Py, but rather store the result Py. However, the computation may also be performed by 4 parallel processing steps where each step computes 8 consecutive values, or by 2 parallel processing steps where each step computes 16 consecutive values. Because the matrix 304 may be partitioned into 4 matrices of 16×16, where in the upper half only 1 of the matrices is not a full 0 matrix, the 16 initial coordinates of Py=PAP$^{-1}$·Px depend only on 16 initial consecutive coordinates of Px, or on the 16 last consecutive coordinates of Px. In any case reading 16 consecutive coordinates of Px is sufficient for producing the first consecutive 16 coordinates of Py. The same is true for the lower half of the matrix. Reading 16 consecutive coordinates of Px is sufficient for producing the last consecutive 16 coordinates of Py, thus Py may be computed in 2 steps where each step involves reading 16 consecutive coordinates of Px and writing 16 consecutive coordinates of Py. Furthermore, each of the non-zero matrices in the upper half and lower half may be partitioned in the same manner (see emphasized lines in the graph), showing that Py may also be computed in 4 steps where each step involves reading 8 consecutive coordinates of Px and writing 8 consecutive coordinates of Py.

This property may be generalized as follows, where P denotes the permutation matrix associated with EO$_l$. For each matrix A which is a cyclic permutation matrix whose order is divisible by 2$^l$, the product Py=PAP$^{-1}$·Px may be computed in l+1 resolutions, where the first resolution involves 1 computing step in which all the coordinates of Px are read, and all the coordinates of Py are computed and written, the second resolution involves 2 computing steps where in each step half of the coordinates of Px are read, and half the coordinates of Py are computed (where half may be either first half or second half). The (l+1)-th resolution involves 2$^l$ computing steps where in each step ½$^l$ consecutive coordinates of Px are read, and ½$^l$ consecutive coordinates of Py are computed.

In HW applications, efficiencies may be attained when reads and writes are performed only for consecutive coordinates, thus the use of an EO transformation on a cyclic matrix provides efficient ways to compute y (or rather Py). For example, the computation may be performed in 4 computation steps of 8 coordinates each, where the resolution of the messages associated with the x and y vectors is 3 bits. Alternatively the computation may be performed in 8 computation steps of 4 coordinates each, where the resolution of the messages associated with the x and y vectors is 6 bits. The same amount of memory is consumed for the 2 modes, but the computation speed and power for the 2 modes may be different.

If H is a mZ*nZ matrix, comprised of block Z*Z matrices of, where each of block matrices is either 0 or a cyclic permutation of the Z*Z identity matrix, (e.g. H is the matrix 208 of FIG. 2, where n=6, and m=3), then H operates on a vector x of length nZ. The EO transformation may be applied by partitioning the vector x into blocks where each block contains Z coordinates and the EO transformation is applied to each block. The matrix representing this transformation may be derived from the identity matrix of order n*n by replacing the diagonal elements with P, (the matrix representing EO when acting on rows), and replacing the 0 elements with block-0 matrices of order Z*Z.

Similarly, the matrix representing this transformation when operating on the columns of H may be derived from the identity matrix of order n*n by replacing the diagonal elements with P$^{-1}$, (the matrix representing EO when acting on columns), and replacing the 0 elements with block-0 matrices of order Z*Z. The matrix representing the transformation EO on the rows of H may be derived from the identity matrix of order m*m by replacing the diagonal elements with P. and replacing the 0 elements with block-0 matrices of order Z*Z.

An EO transformation applied to a vector v may be more formally described as follows: let l denote the order of the transformation, let g≡log$_2$ Z, (where "≡" signifies definition) and let v=[v$_0$ v$_1$ ... v$_{2^g-1}$] be a vector of Z bits. Furthermore, for any number i between 0 and Z−1, the binary representation of the number by g bits is denoted as i$_{[g-1:0]}$. For a vector of bits, the bit-reversal of the vector is denoted by the BR(•) operator.

The direct and inverse EO transformations, may be defined by:

$$EO_l(v)_{i[g-1:0]} = v_{[i[g-l-1:0]BR(i[g-1:g-l])]} \quad \text{(direct transformation) Eq. 1A}$$

$$EO_l^{-1}(v)_{i[g-1:0]} = v_{[BR(i[l-1:0])(i[g-1:l])]} \quad \text{(inverse transformation) Eq. 1B}$$

FIG. 3 is a diagram of a particular example 300 of an even-odd transformation of a block matrix of a parity check matrix that may be used by the data storage device 102 of FIG. 1. When applied to matrices, the even-odd transformation is applied to both the rows and columns of the matrix. FIG. 3 illustrates a Z*Z (Z=32) identity matrix 302 whose columns are cyclically shifted to the right by 13 positions and a matrix 304 that is the result of applying the even-odd transformation 320 of order l=3 to the matrix 302. The matrix 304 is composed of sub-matrices with size (i.e., having dimensions of) 4*4 (4=Z/2$^l$) which are either zero or cyclical shifts (of order 4) of the identity matrix. There are a total of 8 non-zero matrices 331-338 of size 4*4 in the matrix 304. This situation can correspond to a setting where $Z_{ULP}$=32/$Z_{LP}$=16/$Z_{FP}$=4, as an illustrative example.

A QC-LDPC code can be decoded using a variety of decoders or decoding modes, each employing potentially a different value of parallelism. The decoder parallelism levels may be multiples of some base level (such as in the example above where $Z_{FP}$ is a divisor of $Z_{LP}$ and $Z_{ULP}$), though this is not necessary. Each decoder can process a Z-tuple of bits in layers, the number of layers depending on the ratio between the decoder's parallelism and Z.

The actual order in which the sub-matrix blocks are processed may depend on the decoder schedule. For example, an implementation of the decoder 152 may use a serial-C decoding schedule, also referred to as a layered decoder. In this implementation, the check nodes in the graphs may be processed sequentially, where in the processing of a single check node, in each clock cycle, a message is processed which is associated with an edge connected to the check node. The QC nature of the code enables processing of Z messages corresponding to Z check nodes simultaneously. To illustrate multi-resolution operation in this implementation, the decoder 152 may have two decoding modes, D and D' (which can represent the FP and LP decoding modes, for example), which have parallelism of $Z_D$<$Z_{D'}$<Z, where the ratios Z/$Z_D$ and Z/$Z_{D'}$ represent the number of non-zero $Z_D$*$Z_D$ (or $Z_{D'}$*$Z_{D'}$) blocks in each Z*Z block of the matrix. An example of this setting appears in FIG. 3, where $Z_D$=4, $Z_{D'}$=8, and Z=32. The matrix 304 may be considered as a QC-LDPC matrix with parallelism factor $Z_D$, and decoder D could operate as a standard serial-C decoder. However, the transformation (e.g., implemented by the reordering circuit 166) enables the decoder to store the address and shift values at the original LDPC parallelism factor, Z, without storing the address and shift values for $Z_D$. In other words, using only the shift value, the reordering circuitry 166 can operate on a matrix such as the matrix 304 of FIG. 3 using the lower parallelism decoder D. In the context of serial-C decoding, the Z*Z matrix may be logically partitioned into horizontal stripes of $Z_D$ rows and vertical stripes of $Z_D$ columns. The Z edges are processed $Z_D$ edges at a time, where, borrowing from the FIG. 3 example, the first $Z_D$ checks corresponding to the first horizontal stripe process messages corresponding to the variables in vertical stripe 5 (using vertical stripe indices of 0, 1, . . . , 7, starting from the left). During processing of the second horizontal stripe, messages corresponding to variables in vertical stripe 4 are processed, etc. The general relation between the horizontal (or row stripe) index and the original shift k to the vertical (or column stripe) index and the resulting shift is given by equations 2A, 2B and 2C.

$$a_{EO}=k[l-1:0]+BR(\text{rowstripe}[l-1:0])$$ Eq. 2A $$\text{columnstripe}=BR(a_{EO}[l-1:0])$$ Eq. 2B $$\text{shift}=k[g-1:l]+a_{EO}[l]$$ Eq. 2C Referring again to the example of FIG. 3, since k=13= [01101] (in the matrix 302), k[g−1:l]=k[4:3]=[01], and k[l−1:0]=k[2:0]=[101]. The parameters of the 8 non-zero 4*4 matrices computed via the above equations are summarized in Table 1:

TABLE 1

| rowstripe | $a_{EO}$ = k[2:0] + BR(rs[2:0]) | columnstripe = BR($a_{EO}$[2:0]) | shift = k[4:3]+ $a_{EO}$[3] |
|---|---|---|---|
| 0 = [000] | [0101] | [101] = 5 | 1 + 0 = 1 |
| 1 = [001] | [1001] | [100] = 4 | 1 + 1 = 2 |
| 2 = [010] | [0111] | [111] = 7 | 1 + 0 = 1 |
| 3 = [011] | [1011] | [110] = 6 | 1 + 1 = 2 |
| 4 = [100] | [0110] | [011] = 3 | 1 + 0 = 1 |
| 5 = [101] | [1010] | [010] = 2 | 1 + 1 = 2 |
| 6 = [110] | [1000] | [000] = 0 | 1 + 1 = 2 |
| 7 = [111] | [1100] | [001] = 1 | 1 + 1 = 2 |

Operation of decoder D' is similar. Upon reading a set of $Z_{D'}$ messages, these messages may first be de-permuted by performing the inverse EO transformation of order $$\log_2 \frac{Z_{D'}}{Z_D},$$

and the above process may be repeated with the parameters of decoder D replaced by those of decoder D'. If the information is arranged in memory according to the orientation of decoder D, performing the inverse EO transformation converts the arrangement of the data in memory to fit the orientation of decoder D'. As an alternative to performing the inverse EO transformation, another option is to work directly in the D'-domain and use $$\frac{Z_{D'}}{Z_D}$$

barrel shifters. This enables a re-use of existing barrel shifters when decoder D is the FP decoder (e.g., 6 bits per message) and decoder D' is the LP decoder (e.g., 3 bits per message). In this case, there may be full re-use of the barrel shifter layer when $$\frac{Z_{LP}}{Z_{FP}} = 2,$$

such as described in further detail with reference to FIG. 5.

Figure 4:
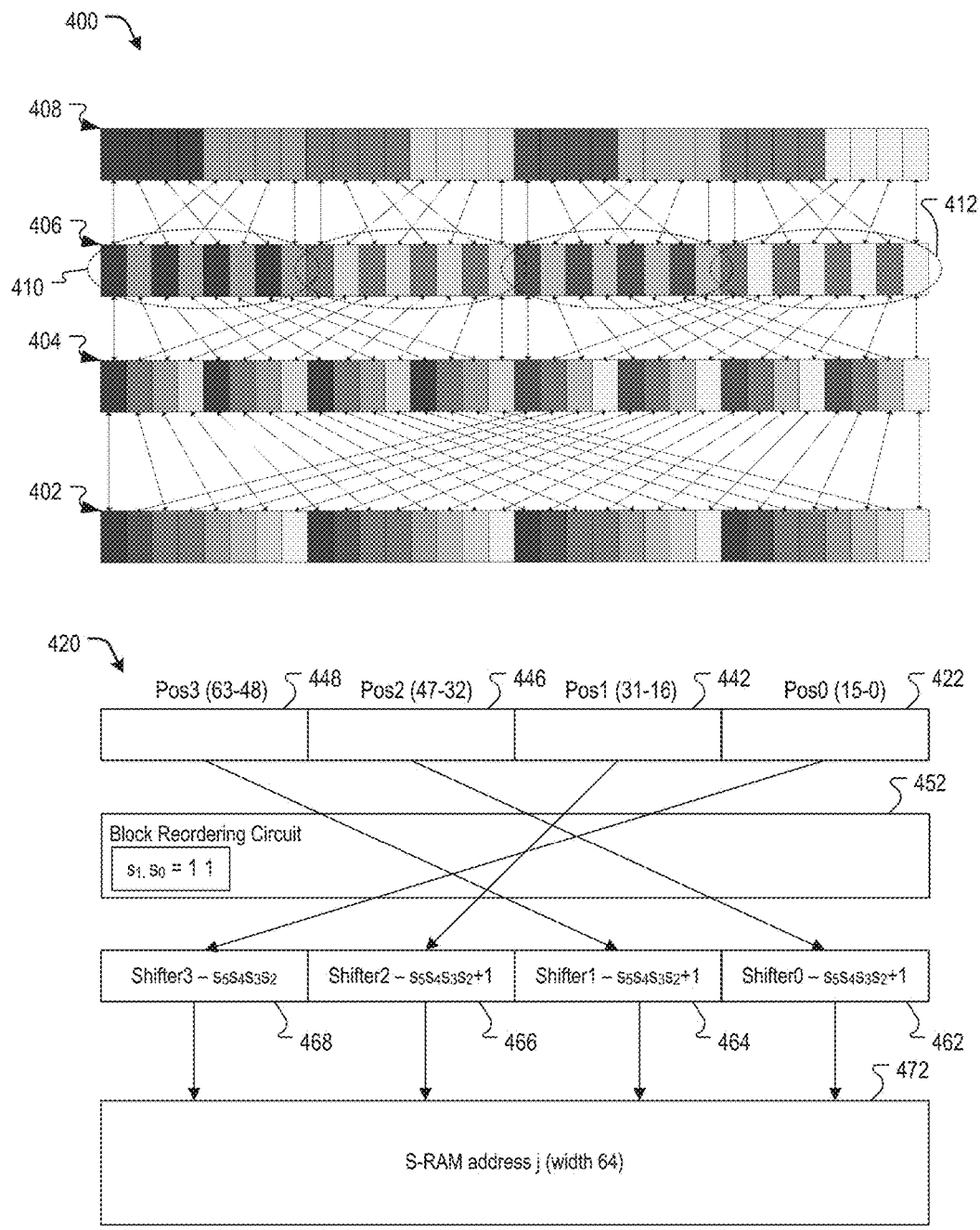
FIG. 4 is a diagram of a particular example of components of the data storage device of FIG. 1 including a reordering circuit and illustrates an example of an even-odd transformation that may be used by the data storage device of FIG. 1.

FIG. 4 is a diagram of a particular example of components of the reordering circuit 166 of FIG. 1 and illustrates an example of permutations that may be applied by the reordering circuit 166, resulting from using an even-odd transformation as described above. A graph 400 illustrates the bit shifts performed by applying the even/odd (E/O) transformation 3 times, consequently generating smaller lifted matrices in FP mode from the original larger matrices of the ULP mode. Bit shifts by the reordering circuit 166 E/O transformation are illustrated for Z=64/32/16.

The graph 400 illustrates a first representation 402 of a single bit-vector of Z=64 bits, a second representation 404 of the bit-vector after a first EO transformation is applied to the first representation 402, a third representation 406 of the bit-vector after a second EO transformation is applied to the second representation 404, and a fourth representation 408 of the bit-vector after a third EO transformation is applied to the third representation 406. Each representation 402-408 may be logically partitioned into one or more pages corresponding to a Z associated with the representation. For example, the first representation 402 may correspond to a single page of Z=64, the second representation 404 may correspond to two pages of Z=32, the third representation 406 may correspond to four pages of Z=16 including representative pages 410 and 412, and the fourth representation 408 may correspond to eight pages of Z=8.

A diagram 420 illustrates block shifts performed by a block reordering tier 452 (e.g., a block reordering circuit) of the reordering circuit 166. In this case, a first block 422 of 16 bits (bits 0-15) is shifted to the highest position in the memory (bits 48-63) and a second block 442 (bits 16-31) is shifted to the next position (bits 32-47). The next two blocks 446 and 448 (bits 32-47 and 48-63 respectively) are shifted to the lower positions (bits 0-15 and bits 16-32). In addition to the block shift, the bits are cyclically shifted within the shifted blocks by a bit shifting tier of the reordering circuit 166. Each shifter 462, 464, 466 and 468 of the bit shifting tier may be configured to perform a barrel-shift by the value denoted in the figure. For example shifter 3 shifts by a shift amount indicated by the 4-bit word formed of the bits "$S_5S_4S_3S_2$".

The reordering circuit 166 may include direct and inverse ("shift-right" and "shift-left") combinational cyclic shifters that perform the shifts illustrated in FIG. 4. "Shift-right" barrel shifters may be used on input data received from the message memory 158 and sent to DPUs groups 167, 168, or 169 for processing, while "shift-left" barrel shifters may receive the output from the DPUs and forward the output back to an address j of an S-RAM 472 (e.g., the message memory 158) having a width of 64.

The barrel shifters 462-468 may be sized for m bits and may be constructed of $\log_2$ m multiplexer layers (2-to-1 multiplexers), where each layer n shifts data either by 0 or $2^n$ bits. The shifters 462-468 may implement bit shifts as computed by applying the direct and inverse EO transforms as described in Eqs. 2A-C to a cyclic shift matrix.

Figure 5:
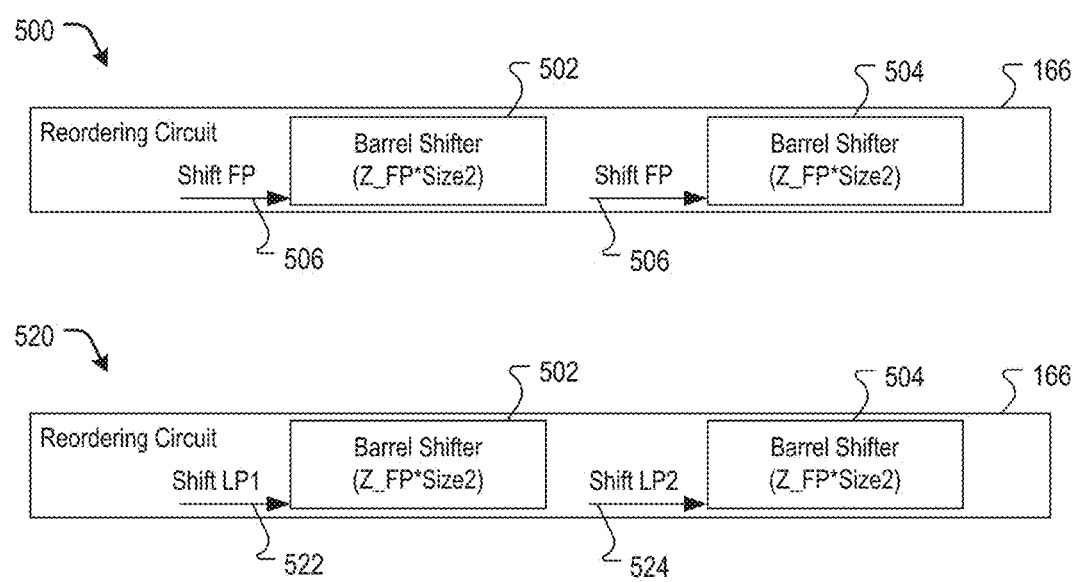
FIG. 5 is a diagram of another particular example of a reordering circuit that may be included in the data storage device of FIG. 1.

FIG. 5 illustrates an example of re-use of buffers of the reordering circuit 166 in FP and LP modes. In a particular example, the reordering circuit 166 may include two barrel shifters with $Z_{LP}$ messages of 4 bits in LP mode or $Z_{FP}$ messages of 7 bits in FP mode. To illustrate, a first configuration 500 of the reordering circuit 166 includes a first barrel shifter 502 and a second barrel shifter 504 (e.g., the shifters 462-468 of FIG. 4) that are each sized to handle $Z_{FP}$ messages, where LP messages have a size "Size1" (e.g., 3 bits) and FP messages have a size "Size2" (e.g., 6 bits). In the first configuration 500, the reordering circuit operates in a FP mode, and each of the shifters 502, 504 receives a shift value 506 corresponding to a FP shift amount. In a second configuration 520, the reordering circuit 166 operates in a LP mode, and each of the shifters 502, 504 receives a different LP shift value 522, 524 to accommodate twice the number of messages (of approximate half the size) as in the FP mode using the same set of shifters 502-504. It should be noted that reordering circuit 166 may implement different shifts per power mode (e.g., FP, LP and ULP) according to the EO transformations applied and the number of DPUs utilized to process the data in parallel in each mode.

In an illustrative, non-limiting example of multi-mode decoder operation, the initial LDPC cyclic shifted matrix may be 64*64 ($Z_{ULP}$=64) and smaller cyclic shifted 32*32 ($Z_{LP}$=32) and 16*16 ($Z_{FP}$=16) matrices using the EO transformation of order 2 are used in LP and FP modes. The decoder 152 may apply EO transformation of order 2 to recover the structure of 64*64 matrices in ULP mode and may use 64 DPUs in parallel to calculate the checks and update the variables. In LP mode, the decoder 152 may apply a single inverse EO transformation to recover the structure of 32*32 matrices and may use 32 DPUs in parallel to calculate the checks and update the variables. In FP mode, the decoder 152 may use the 16*16 matrix and may use 16 DPUs in parallel to calculate the checks and update the variables.

It should be noted that the Z gear LDPC engine in the present example may re-use hardware, for example, when messages may be 7 bits in FP mode and 4 bits in LP mode. The same barrel shifter buffer may be used in the reordering circuit 166 to shift 16 values of 7 bits in FP mode and to shift 32 values of 4 bits in LP mode, similar to the configurations illustrated in FIG. 5. Additionally, as described previously, the same 16 FP DPUs may utilized in both FP and LP modes, and an additional 16 DPUs may be utilized in the LP mode (so that 32 DPUs are used in LP mode). Another 64 DPUs may be utilized in the ULP mode.

Figure 6:
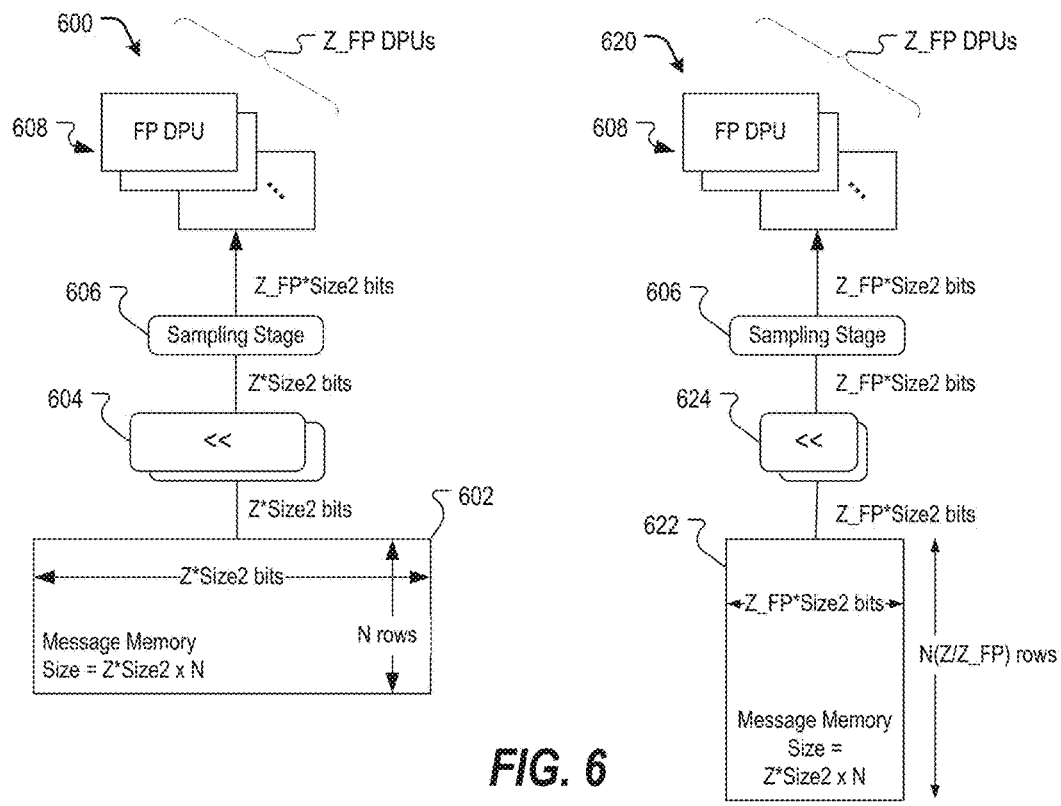
FIG. 6 is a diagram illustrating an example of components including a message memory that may be included in the data storage device of FIG. 1.

FIG. 6 depicts a comparison between two LDPC decoders 600 and 620 which use a QC-LDPC code with parallelism Z but are using a reduced number of $Z_{FP}$ DPU's. Decoder 600 includes a message memory 602, shifters 604, a sampling stage 606, and a set of $Z_{FP}$ DPUs 608. Decoder 600 has the message memory 602 sized to read Z messages of FP message size ("Size2" bits). The shifters 604 are sized to operate on the Z*Size2 bits read from the memory 602, the sampling stage 606 is sized to sample the $Z_{FP}$*Size2 bits to be sent to the DPUs 608. Decoder 620 includes a narrower message memory 622 than decoder 600 and shifters 624, with the memory 622 and the shifters 624 sized to accommodate $Z_{FP}$*Size2 bits rather than Z*Size2 bits. Decoder 600 does not use the Z-Gear LDPC EO-transform; therefore, the message data of size 7*Z (Z=512) is shifted across the entire row and the decoder 600 must read the full 7*Z messages, shift Z*7 messages, and then get the data sub-set. In decoder 620 that uses the Z-Gear EO-transform, the data is block-shifted and therefore may be stored in a much narrower memory, only 7*$Z_{FP}$ ($Z_{FP}$=64) bits are read every cycle, and only 7*$Z_{FP}$ bits are shifted and sampled. Thus, use of the EO transform may enable reduced component size and power consumption.

Figure 7:
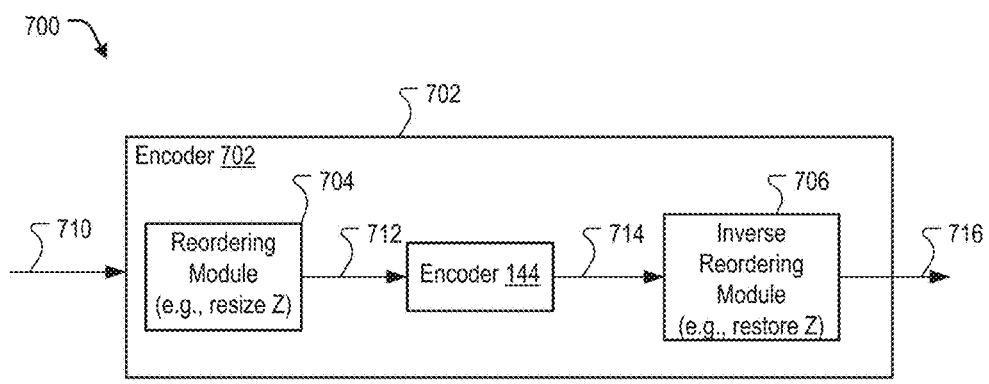
FIG. 7 is a diagram illustrating an example of an encoder that may be included in the data storage device of FIG. 1.

FIG. 7 depicts a Z gear LDPC engine encoder 702. The LDPC encoder 702 may include a reordering module 704, the encoder 144, and an inverse reordering module 706. The reordering module 704 may perform an EO transformation on input user data 710 (e.g., in chunks of 512 bits). Next a quasi-cyclic LDPC encoding is performed on the transformed data 712 by the encoder 144 with optionally the maximal Z value of the parity check matrix 142 to calculate parity bits. An inverse EO transformation is performed by the inverse reordering module 706 on the encoded data 714, and the resulting data and parity 716 are written to the memory 104.

Figure 8:
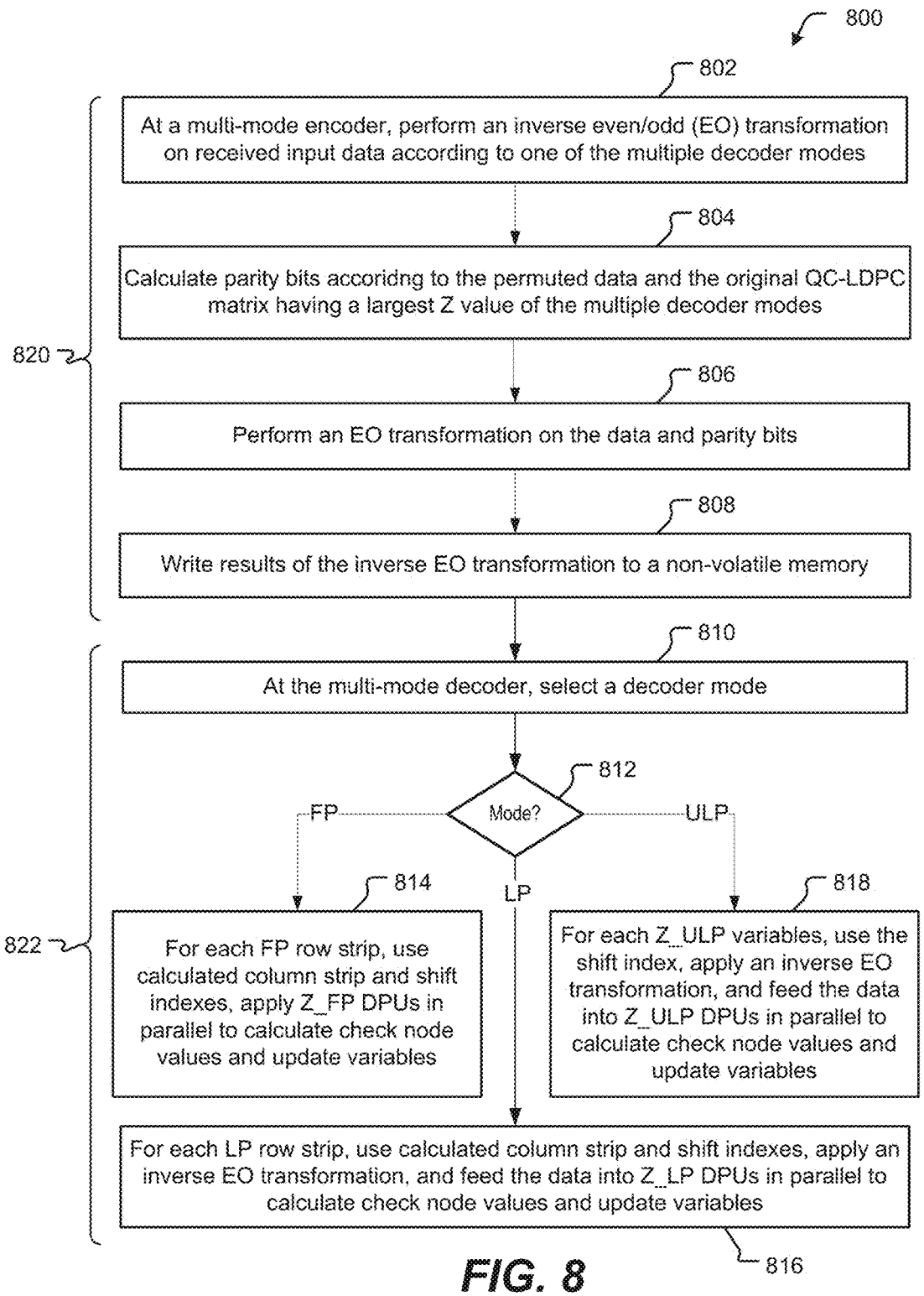
FIG. 8 is a flow diagram of a particular example of a method of operation that may be performed by the data storage device of FIG. 1.

Referring to FIG. 8, a particular illustrative example of a method of operation of a device is depicted and generally designated 800. The method 800 may be performed at a data storage device, such as at the controller 130 coupled to the memory device 103 of FIG. 1. For example, the method 800 may be performed at a high throughput and low power Z gear LDPC engine, such as the ECC engine 138, configured to process data using a varying number of DPUs in parallel, e.g., different Z values. The encoder and decoder may be described by a QC LDPC matrix with a "maximal" Z value.

The method 800 may include a first method 820 (corresponding to a method of encoding) and a second method 822 (corresponding to a method of decoding). For example, the first method 820 may be performed by an encoder, such as the encoder 144 of FIG. 1 or the encoder 702 of FIG. 7, and the second method 822 may be performed by a multi-mode decoder, such as the decoder 152 of FIG. 1. Although described as part of a single method 800, in other implementations, the first method 820 may be performed independent of the second method 822 and vice versa.

The method 800 includes, at the multi-mode encoder, performing an inverse even/odd (EO) transformation on received input data according to one of multiple decoder modes, at 802. For example, the inverse EO transformation may be performed by the reordering circuit 166 of FIG. 1 or by the reordering module 704 of FIG. 7. The method 800 includes calculating parity bits according to permuted data and an original QC-LDPC matrix having a largest Z value of the multiple decoder modes, at 804.

The method 800 includes performing an EO transformation on the data and parity bits, at 806, and writing the results of the EO transformation to a non-volatile memory, at 808. For example, the EO transformation may be performed by the reordering circuit 166 of FIG. 1 or by the reordering module 706 of FIG. 7. The non-volatile memory may include or correspond to the memory device 103 (e.g., the memory 104) of FIG. 1.

In another implementation the block 802 may perform an EO transformation and the block 806 may perform an EO transformation.

The method 800 also includes, at the multi-mode decoder, selecting a decoder mode, at 810. Processing may advance based on the selected mode, at 812. To illustrate, if the FP mode is selected at 810, the method 800 may include, for each FP row strip, using calculated column strip and shift indexes and applying $Z_{FP}$ DPUs in parallel to calculate check node value and update variables, at 814. Alternatively, if the LP mode is selected at 810, the method 800 may include, for each LP row strip, using calculated column strip and shift indexes, applying an inverse EO transformation, and feeding the data into $Z_{LP}$ DPUs in parallel to calculate check node values and update variables, at 816. If the ULP mode is selected at 810, the method 800 may include, for each $Z_{ULP}$, using the shift index, applying an inverse EO transformation, and feeding the data into $Z_{ULP}$ DPUs in parallel to calculate check node values and update variables, at 818.

By selecting a decoding mode and applying an EO transformation based on the selected decoding mode, adjustable amount of parallelism may be used by the multi-mode decoder. As a result, a number of DPUs for each mode may be selected based on power consumption, complexity, and frequency of use of the respective mode without storing multiple representations of the code for each mode. Further, by encoding permuted data, the encoded data may be stored in a configuration for efficient decoding in a selected decoding mode (e.g., an LP mode).

Figure 9:
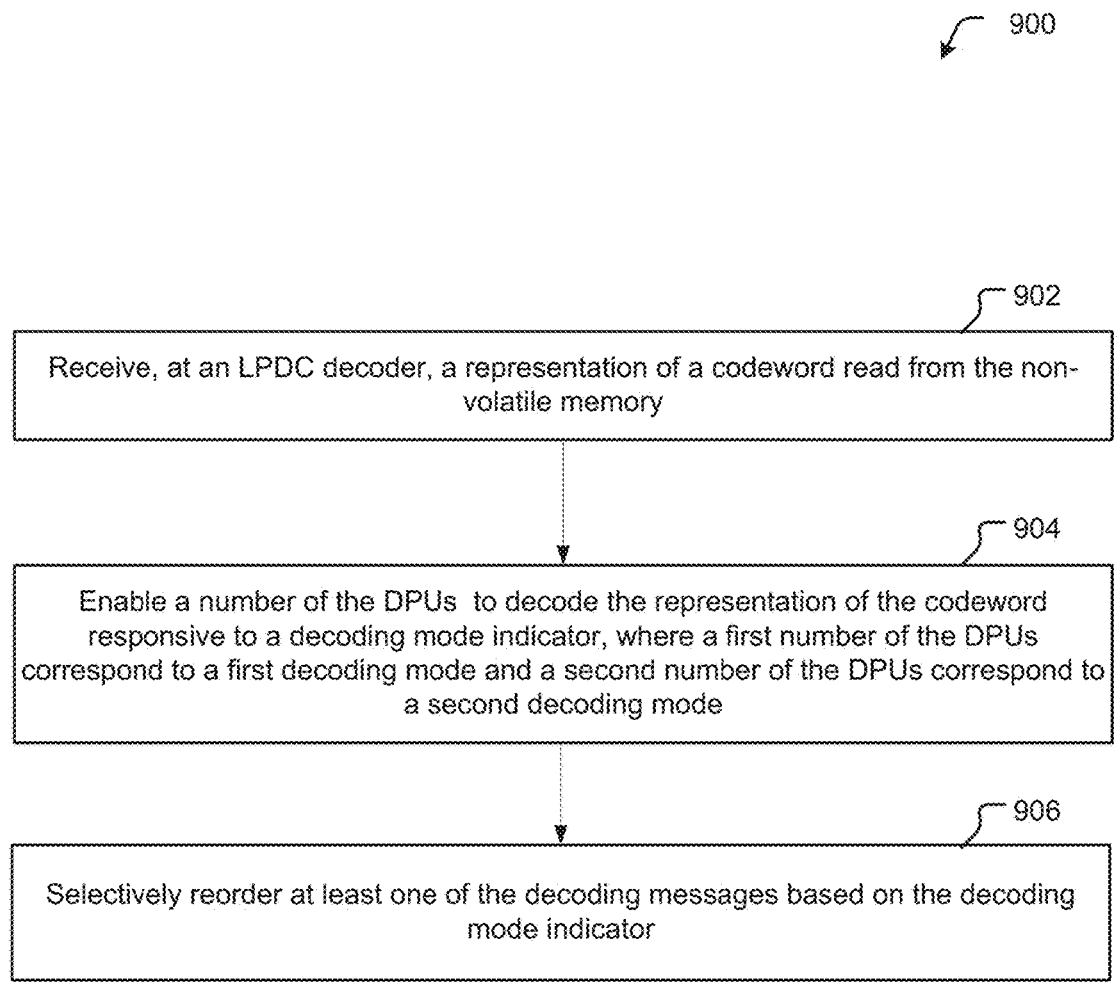
FIG. 9 is a flow diagram of another particular example of a method of operation that may be performed by the data storage device of FIG. 1.

Referring to FIG. 9, a particular illustrative example of a method of operation of a device is depicted and generally designated 900. The method 900 may be performed at a data storage device, such as at the decoder 152 of FIG. 1.

The method 900 includes receiving, at a low density parity check (LDPC) decoder, a representation of a codeword read from a non-volatile memory, at 902. For example, the LDPC decoder may include or correspond to the decoder 152 of FIG. 1. In some implementations, the LDPC decoder and the non-volatile memory may be included in the same device, such as the data storage device 102 of FIG. 1. For example, the non-volatile memory may include or correspond to the memory device 103 (e.g., the memory 104) of FIG. 1.

In some implementations, the LDPC decoder may include multiple data processing units (DPUs), a control circuit, a reordering circuit, a message memory configured to store decoding messages, or a combination thereof. For example, the multiple DPUs may include or correspond to the DPUs 165 of FIG. 1. The control circuit, the reordering circuit, and the message memory may include or correspond to the control circuit 140, the reordering circuit 166, and the message memory 158, respectively, of FIG. 1. In other implementations, one or more of the multiple data processing units (DPUs), a control circuit, a reordering circuit, or a message memory may be external to the LDPC decoder.

The method 900 also includes enabling a number of the DPUs to decode the representation of the codeword responsive to a decoding mode indicator, where a first number of the DPUs correspond to a first decoding mode and a second number of the DPUs correspond to a second decoding mode, at 904. For example, the decoding mode indicator may include or correspond to the ECC mode indicator 176 of FIG. 1. In some implementations, power consumption of the LDPC decoder per cycle of a decoder clock (e.g., the clock 172 of FIG. 1) in the first decoding mode may be substantially the same as in the second decoding mode.

The method 900 further includes selectively reordering at least one of the decoding messages based on the decoding mode indicator, at 906. For example, the reordering circuit 166 of FIG. 1 may be configured to perform reordering corresponding to one or more layers of EO transformation, such as described with reference to FIG. 4, to messages transferred between the message memory 158 and the enabled DPUs of the DPUs 165. In some implementations, reordering the at least one decoding message corresponds to transforming a quasi-cyclic LDPC (QC-LDPC) parity check matrix (e.g., the parity check matrix 142 of FIG. 1) having a first block matrix size to a second QC-LDPC parity check matrix having a second block matrix size.

In some implementations, the first decoding mode uses first decoding messages having a first size and the second decoding mode uses second decoding messages having a second size that is larger than the first size. In such implementations, the first number of DPUs may be greater than the second number of DPUs. Additionally, in a first illustrative example, the first decoding mode corresponds to a bit-flipping configuration (e.g., a ULP decoding mode) and the second decoding mode corresponds to an iterative message-passing decoding configuration. In the first illustrative example, the first size may be one bit. Alternatively, in a second illustrative example, the first decoding mode corresponds to a first iterative message-passing decoding configuration (e.g., a LP decoding mode) and the second decoding mode corresponds to a second iterative message-passing decoding configuration (e.g., a FP decoding mode). In the second illustrative example, the first number may be twice the second number, and the second size may be twice the first size. Numbers of active DPUs in each particular decoding mode may be set to be inversely proportional to average power consumption of the active DPUs in the particular decoding mode, proportional to a frequency of use of the particular decoding mode, inversely proportional to message resolution of the active DPUs in the particular decoding mode, or any combination thereof.

In some implementations, in the first decoding mode the LDPC decoder processes a first permuted version of the representation of the codeword, and in the second decoding mode the LDPC decoder processes a second permuted version of the representation of the codeword. In the first decoding mode, the LDPC decoder may be configured to process the representation of the codeword based on a first permuted version of a quasi-cyclic LDPC (QC-LDPC) parity check matrix, and in the second decoding mode the LDPC decoder is configured to process the representation of the codeword based on a second permuted version of the QC-LDPC parity check matrix. In another implementation, in the first decoding mode the LDPC decoder is configured to process the representation of the codeword based on a first quasi-cyclic LDPC (QC-LDPC) parity check matrix, and in the second decoding mode the LDPC decoder is configured to process the representation of the codeword based on a second QC-LDPC parity check matrix.

Although various components depicted herein are illustrated as block components and described in general terms, such components may include one or more microprocessors, state machines, or other circuits configured to enable the controller 130 to implement the decoder 152 of FIG. 1. For example, the control circuit 140, the reordering circuit 166, or a combination thereof, may represent physical components, such as hardware controllers, state machines, logic circuits, or other structures, to perform block shifts and bit-shifts in accordance with one or more EO transformations associated with a decoding mode indicated by the ECC mode indicator 176. The control circuit 140, the reordering circuit 166, or both, may be implemented using a microprocessor or microcontroller programmed to perform block shifts and bit-shifts in accordance with one or more EO transformations associated with a decoding mode indicated by the ECC mode indicator 176.

Although the controller 130 and certain other components described herein are illustrated as block components and described in general terms, such components may include one or more microprocessors, state machines, and/or other circuits configured to enable the data storage device 102 (or one or more components thereof) to perform operations described herein. Components described herein may be operationally coupled to one another using one or more nodes, one or more buses (e.g., data buses and/or control buses), one or more other structures, or a combination thereof. One or more components described herein may include one or more physical components, such as hardware controllers, state machines, logic circuits, one or more other structures, or a combination thereof, to enable the data storage device 102 to perform one or more operations described herein.

Alternatively or in addition, one or more aspects of the data storage device 102 may be implemented using a microprocessor or microcontroller programmed (e.g., by executing instructions) to perform one or more operations described herein, such as one or more operations of the methods 800-900. In a particular embodiment, the data storage device 102 includes a processor executing instructions (e.g., firmware) retrieved from the memory device 103. Alternatively or in addition, instructions that are executed by the processor may be retrieved from memory separate from the memory device 103, such as at a read-only memory (ROM) that is external to the memory device 103.

In conjunction with the described aspects, an apparatus includes means for storing a representation of a codeword. For example, the means for storing a representation of a codeword may include or correspond to the memory device 103 of FIG. 1, the memory 104 of FIG. 1, one or more other structures, devices, circuits, modules, or instructions to store the representation of the codeword, or a combination thereof.

The apparatus also includes means for low-density parity check (LDPC) decoding the representation of the codeword. For example, the means for LDPC decoding the representation of the codeword may include or correspond to the decoder 152 of FIG. 1, the control circuit 140 of FIG. 1, the DPUs 165 of FIG. 1, one or more other structures, devices, circuits, modules, or instructions to LDPC decode the representation of the codeword, or a combination thereof.

The means for LDPC decoding includes means for storing decoding messages. For example, the means for storing decoding message may include or correspond to the message memory 158 of FIG. 1, the variable node partition 160 of FIG. 1, the check node partition 162 of FIG. 1, one or more other structures, devices, circuits, modules, or instructions to store the decoding messages, or a combination thereof.

The means for LDPC decoding includes multiple means for processing data. For example, the multiple means for processing data may include or correspond the DPUs 165 of FIG. 1, one or more other structures, devices, circuits, modules, or instructions process data, or a combination thereof.

The means for LDPC decoding includes means for enabling a first number of the means for processing data to decode the representation of the codeword in response to a decoding mode indicator indicating a first decoding mode and for enabling a second number of the means for processing data to decode the representation of the codeword in response to the decoding mode indicator indicating a second decoding mode. For example, the means for enabling the first number of the DPUs to decode the representation of the codeword and for enabling the second number of the DPUs to decode the representation of the codeword may include or correspond to the control circuit 140 of FIG. 1, one or more other structures, devices, circuits, modules, or instructions to enable the first number of the means for processing data to decode the representation of the codeword and to enable the second number of the means for processing data to decode the representation of the codeword, or a combination thereof.

The means for LDPC decoding includes means for selectively reordering at least one of the decoding messages based on the decoding mode indicator. For example, the means for selectively reordering may include or correspond to the reordering circuit 166 of FIG. 1, the block reordering tier circuit 452 of FIG. 4, the shifters 462-468 of FIG. 4, one or more other structures, devices, circuits, modules, or instructions to selectively reorder at least one of the decoding messages, or a combination thereof. In some implementations, reordering the at least one decoding message corresponds to transforming a quasi-cyclic LDPC (QC-LDPC) parity check matrix having a first block matrix size to a second QC-LDPC parity check matrix having a second block matrix size.

It should be appreciated that one or more operations described herein as being performed by the controller 130 may be performed at the memory device 103. As an illustrative example, in-memory ECC operations (e.g., encoding operations and/or decoding operations) may be performed at the memory device 103 alternatively or in addition to performing such operations at the controller 130.

To further illustrate, the data storage device 102 may be configured to be coupled to the access device 170 as embedded memory, such as in connection with an embedded MultiMedia Card (eMMC®) (trademark of JEDEC Solid State Technology Association, Arlington, Va.) configuration, as an illustrative example. The data storage device 102 may correspond to an eMMC device. As another example, the data storage device 102 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). The data storage device 102 may operate in compliance with a JEDEC industry specification. For example, the data storage device 102 may operate in compliance with a JEDEC eMMC specification, a JEDEC Universal Flash Storage (UFS) specification, one or more other specifications, or a combination thereof.

The memory device 103 may include a three-dimensional (3D) memory, such as a resistive random access memory (ReRAM), a flash memory (e.g., a NAND memory, a NOR memory, a single-level cell (SLC) flash memory, a multi-level cell (MLC) flash memory, a divided bit-line NOR (DINOR) memory, an AND memory, a high capacitive coupling ratio (HiCR) device, an asymmetrical contactless transistor (ACT) device, or another flash memory), an erasable programmable read-only memory (EPROM), an electrically-erasable programmable read-only memory (EEPROM), a read-only memory (ROM), a one-time programmable memory (OTP), or a combination thereof. Alternatively or in addition, the memory device 103 may include another type of memory. In a particular embodiment, the data storage device 102 is indirectly coupled to an access device (e.g., the access device 170) via a network. For example, the data storage device 102 may be a network-attached storage (NAS) device or a component (e.g., a solid-state drive (SSD) component) of a data center storage system, an enterprise storage system, or a storage area network. The memory device 103 may include a semiconductor memory device.

Semiconductor memory devices include volatile memory devices, such as dynamic random access memory ("DRAM") or static random access memory ("SRAM") devices, non-volatile memory devices, such as resistive random access memory ("ReRAM"), magnetoresistive random access memory ("MRAM"), electrically erasable programmable read only memory ("EEPROM"), flash memory (which can also be considered a subset of EEPROM), ferroelectric random access memory ("FRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure. In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate). As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Alternatively, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this disclosure is not limited to the two dimensional and three dimensional exemplary structures described but cover all relevant memory structures within the spirit and scope of the disclosure as described herein and as understood by one of skill in the art. The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments. Those of skill in the art will recognize that such modifications are within the scope of the present disclosure.

The above-disclosed subject matter is to be considered illustrative, and not restrictive, and the appended claims are intended to cover all such modifications, enhancements, and other embodiments, that fall within the scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A device comprising:
a non-volatile memory; and
a low density parity check (LDPC) decoder configured to receive a codeword read from the non-volatile memory, the LDPC decoder comprising:
 a message memory configured to store decoding messages;
 multiple data processing units (DPUs);
 a control circuit responsive to a decoding mode indicator, the control circuit configured to enable a first number of the DPUs to decode the codeword in response to the decoding mode indicator indicating a first decoding mode and to enable a second number of the DPUs to decode the codeword in response to the decoding mode indicator indicating a second decoding mode, wherein the first number of DPUs is different than the second number of DPUs; and
 a reordering circuit coupled to the control circuit and configured to selectively reorder at least one of the decoding messages based on the decoding mode indicator.

2. The device of claim 1, wherein the LDPC decoder is configured to process the codeword based on a quasi-cyclic LDPC (QC-LDPC) parity check matrix that has a first block matrix size, and wherein the reordering circuit is configured to selectively reorder the decoding messages to transform the QC-LDPC parity check matrix to a second QC-LDPC parity check matrix having a second block matrix size.

3. The device of claim 2, wherein the reordering circuit is further configured to selectively reorder the decoding messages to transform the QC-LDPC parity check matrix to a third QC-LDPC parity check matrix having a third block matrix size.

4. The device of claim 1, wherein the first decoding mode uses first decoding messages having a first size, the second decoding mode uses second decoding messages having a second size that is larger than the first size, and the first number of DPUs is greater than the second number of DPUs.

5. The device of claim 4, wherein each iteration of a first decoding operation of the first decoding mode uses the first decoding messages to generate first modified decoding messages, wherein each of the first decoding messages resides in consecutive memory addresses, and wherein each of the first modified decoding messages is written into consecutive memory addresses.

6. The device of claim 4, wherein each iteration of a second decoding operation of the second decoding mode uses the second decoding messages to generate second modified decoding messages, wherein each of the second decoding messages resides in consecutive memory addresses, and wherein each of the second modified decoding messages is written into consecutive memory addresses.

7. The device of claim 4, further comprising a decoder clock, wherein a first frequency of the decoder clock in the first decoding mode is substantially the same as a second frequency of the decoder clock in the second decoding mode, and wherein a first power consumption of the LDPC decoder per cycle of the decoder clock in the first decoding mode is substantially the same as a second power consumption of the LDPC decoder per cycle of the decoder clock in the second decoding mode.

8. The device of claim 1, wherein the message memory includes:
 a variable node memory configured to store decoding messages corresponding to variable node values; and
 a check node memory configured to store decoding messages corresponding to check node values, and wherein the LDPC decoder further comprises:
 an output buffer coupled to the variable node memory;
 a first data processing unit (DPU) module including a first group of DPUs corresponding to the first decoding mode;
 a second DPU module including a second group of DPUs corresponding to the second decoding mode; and
 a third DPU module including a third group of DPUs corresponding to a third decoding mode.

9. The device of claim 1, wherein numbers of active DPUs in each particular decoding mode are set to be are inversely proportional to average power consumption of the active DPUs in the particular decoding mode, proportional to a frequency of use of the particular decoding mode, inversely proportional to message resolution of the active DPUs in the particular decoding mode, or any combination thereof.

10. The device of claim 1, wherein in the first decoding mode the reordering circuit generates a first permuted version of the codeword, and in the second decoding mode the reordering circuit generates a second permuted version of the codeword.

11. The device of claim 1, wherein in the first decoding mode the LDPC decoder is configured to process the codeword based on a first permuted version of a quasi-cyclic LDPC (QC-LDPC) parity check matrix and wherein in the second decoding mode the LDPC decoder is configured to process the codeword based on a second permuted version of the QC-LDPC parity check matrix.

12. The device of claim 1, wherein in the first decoding mode the LDPC decoder is configured to process the codeword based on a first quasi-cyclic LDPC (QC-LDPC) parity check matrix and wherein in the second decoding mode the LDPC decoder is configured to process the codeword based on a second QC-LDPC parity check matrix.

13. A method comprising:
at a device including a non-volatile memory and a low density parity check (LDPC) decoder, the LDPC decoder including multiple data processing units (DPUs), a control circuit, a reordering circuit, and a message memory configured to store decoding messages, performing:
receiving, at the LDPC decoder, a codeword read from the non-volatile memory,
enabling a first number of the DPUs to decode the codeword in response to a decoding mode indicator indicating a first decoding mode,
enabling a second number of the DPUs to decode the codeword in response to the decoding mode indicator indicating a second decoding mode, wherein the first number of DPUs is different than the second number of DPUs; and
selectively reordering at least one of the decoding messages based on the decoding mode indicator.

14. The method of claim 13, wherein reordering the at least one decoding message corresponds to transforming a quasi-cyclic LDPC (QC-LDPC) parity check matrix having a first block matrix size to a second QC-LDPC parity check matrix having a second block matrix size.

15. The method of claim 13, wherein the first decoding mode uses first decoding messages having a first size, the second decoding mode uses second decoding messages having a second size that is larger than the first size, and the first number of DPUs is greater than the second number of DPUs.

16. The method of claim 15, wherein the first decoding mode corresponds to a bit-flipping configuration, the first size is one bit, and the second decoding mode corresponds to an iterative message-passing decoding configuration.

17. The method of claim 15, wherein the first decoding mode corresponds to a first iterative message-passing decoding configuration, the second decoding mode corresponds to a second iterative message-passing decoding configuration, the first number is twice the second number, and the second size is twice the first size.

18. An apparatus comprising:
means for storing a codeword; and
means for low-density parity check (LDPC) decoding the codeword, the means for LDPC decoding comprising:
means for storing decoding messages;
means for processing data;
means for enabling a first number of the means for processing data to decode the codeword in response to a decoding mode indicator indicating a first decoding mode and for enabling a second number of the means for processing data to decode the codeword in response to the decoding mode indicator indicating a second decoding mode, wherein the first number of DPUs is different than the second number of DPUs; and
means for selectively reordering at least one of the decoding messages based on the decoding mode indicator.

19. The apparatus of claim 18, wherein reordering the at least one decoding message corresponds to transforming a quasi-cyclic LDPC (QC-LDPC) parity check matrix having a first block matrix size to a second QC-LDPC parity check matrix having a second block matrix size.

* * * * *